United States Patent
Shang et al.

(10) Patent No.: US 11,763,740 B2
(45) Date of Patent: Sep. 19, 2023

(54) SIGNAL GENERATION CIRCUIT, SIGNAL GENERATION METHOD, SIGNAL GENERATION MODULE AND DISPLAY DEVICE

(71) Applicant: BOE Technology Group Co., Ltd., Beijing (CN)

(72) Inventors: Guangliang Shang, Beijing (CN); Libin Liu, Beijing (CN); Tian Dong, Beijing (CN); Jiangnan Lu, Beijing (CN); Shiming Shi, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/762,330

(22) PCT Filed: Apr. 15, 2021

(86) PCT No.: PCT/CN2021/087435
§ 371 (c)(1),
(2) Date: Mar. 21, 2022

(87) PCT Pub. No.: WO2021/238480
PCT Pub. Date: Dec. 2, 2021

(65) Prior Publication Data
US 2022/0343841 A1    Oct. 27, 2022

(30) Foreign Application Priority Data
May 28, 2020 (CN) .......................... 202010481958.2

(51) Int. Cl.
*G09G 3/20* (2006.01)
*G09G 3/3208* (2016.01)
(Continued)

(52) U.S. Cl.
CPC ........... *G09G 3/3225* (2013.01); *G11C 19/28* (2013.01); *G09G 2300/0426* (2013.01);
(Continued)

(58) Field of Classification Search
CPC ......... G09G 3/3225; G09G 2300/0426; G09G 2300/0852; G09G 2310/0286;
(Continued)

(56) References Cited

U.S. PATENT DOCUMENTS

2013/0257754 A1   10/2013  Liu et al.
2017/0039950 A1   2/2017   Li et al.
(Continued)

FOREIGN PATENT DOCUMENTS

CN        103021321 A       4/2013
CN        103151076 A       6/2013
(Continued)

OTHER PUBLICATIONS

CN 202010481958.2 first office action.
PCT/CN2021/087435 international search report and written opinion.

*Primary Examiner* — Lin Li
(74) *Attorney, Agent, or Firm* — IPRO, PLLC

(57) ABSTRACT

The present disclosure provides a signal generation circuit, a signal generation method, a signal generation module and a display device. The signal generating circuit includes an input terminal, a signal output terminal, a transmission control circuit, a first output circuit, and an output control circuit; the output control circuit is electrically connected to a first output control terminal, a second output control terminal, a second voltage terminal, the signal writing-in terminal, the signal output terminal and the first voltage terminal, configured to control to connect the signal writing-in terminal and the second voltage terminal under the control (Continued)

of a second output control signal provided by the second output control terminal, and control to connect the signal output terminal and the first voltage terminal under the control of a first output control signal provided by the first output control terminal. The present disclosure expands an adjustment range of frequency of a PWM signal.

14 Claims, 15 Drawing Sheets

(51) Int. Cl.
  *G11C 19/28* (2006.01)
  *G09G 3/3225* (2016.01)
(52) U.S. Cl.
  CPC .............. *G09G 2300/0852* (2013.01); *G09G 2310/0286* (2013.01); *G09G 2310/08* (2013.01); *G09G 2320/0223* (2013.01); *G09G 2320/0233* (2013.01); *G09G 2320/0247* (2013.01)
(58) Field of Classification Search
  CPC ........ G09G 2310/08; G09G 2320/0223–0247; G11C 19/28
  See application file for complete search history.

(56) References Cited

U.S. PATENT DOCUMENTS

| | | | |
|---|---|---|---|
| 2018/0082623 A1* | 3/2018 | Wang | G11C 19/28 |
| 2018/0151125 A1 | 5/2018 | Lee | |
| 2019/0005866 A1 | 1/2019 | Li et al. | |
| 2019/0066568 A1 | 2/2019 | Wu et al. | |
| 2019/0073933 A1* | 3/2019 | Xuan | G11C 19/28 |
| 2020/0143730 A1 | 5/2020 | Zheng | |
| 2020/0219576 A1* | 7/2020 | Yao | G09G 3/20 |
| 2021/0142709 A1 | 5/2021 | Liu et al. | |
| 2021/0241708 A1* | 8/2021 | Pu | G11C 19/28 |

FOREIGN PATENT DOCUMENTS

| | | | | |
|---|---|---|---|---|
| CN | 103365463 A | | 10/2013 | |
| CN | 106205461 A | | 12/2016 | |
| CN | 106887209 A | * | 6/2017 | ............. G11C 19/28 |
| CN | 108122542 A | | 6/2018 | |
| CN | 108417170 A | | 8/2018 | |
| CN | 109637421 A | | 4/2019 | |
| CN | 109712557 A | * | 5/2019 | ............... G09G 3/20 |
| CN | 110033734 A | * | 7/2019 | ............ G09G 3/3208 |
| CN | 110197697 A | | 9/2019 | |
| CN | 111508433 A | | 8/2020 | |

* cited by examiner

SIGNAL GENERATION CIRCUIT, SIGNAL GENERATION METHOD, SIGNAL GENERATION MODULE AND DISPLAY DEVICE

CROSS-REFERENCE TO RELATED APPLICATION

This application is the U.S. national phase of PCT Application No. PCT/CN2021/087435 filed on Apr. 15, 2021, which claims priorities of the Chinese patent application No. 202010481958.2 filed on May 28, 2020, which is incorporated herein by reference in its entity.

TECHNICAL FIELD

The present disclosure relates to the field of display technology, and more particularly to a signal generation circuit, a signal generation method, a signal generation module and a display device.

BACKGROUND

At present, light emitting time of the pixels of Active-matrix organic light-emitting diode, active matrix organic light-emitting diode (AMOLED) display devices are almost always adjusted by light-emitting control signals to realize pulse width modulation (PWM) dimming. The adjustment frequency that can be achieved by this adjustment method is low, generally in the range from one frame frequency to a quarter of a line frequency. The lower frequency is more prone to flickering, especially when scanning the QR code, it is prone to problems such as long recognition time and recognition errors, which need to be solved by increasing the PWM frequency.

SUMMARY

The objective of the present disclosure is to provide a signal generation circuit, a signal generation method, a signal generation module and a display device.

A first aspect of the present disclosure provides a signal generation circuit, including an input terminal, a signal output terminal, a transmission control circuit, a first output circuit, and an output control circuit; wherein the transmission control circuit is electrically connected to the input terminal, a first node, a second node, and is configured to control a potential of the first node and a potential of the second node under the control of a first clock signal, a second clock signal and an input signal; the first output circuit is respectively electrically connected to a signal writing-in terminal, the first node, the second node, a first voltage terminal and the signal output terminal, and is configured to connect the signal output terminal and the first voltage terminal under the control of the potential of the first node, and control to connect the signal output terminal and the signal writing-in terminal under the control of the potential of the second node; the output control circuit is respectively electrically connected to a first output control terminal, a second output control terminal, a second voltage terminal, the signal writing-in terminal, the signal output terminal and the first voltage terminal, configured to control to connect the signal writing-in terminal and the second voltage terminal under the control of a second output control signal provided by the second output control terminal, and control to connect the signal output terminal and the first voltage terminal under the control of a first output control signal provided by the first output control terminal.

Optionally, the signal generating circuit further includes a shift signal output terminal and a shift signal output circuit; wherein the shift signal output circuit is electrically connected to the first node, the second node and the shift signal output terminal respectively, and is configured to control the shift signal output terminal to output the shift signal under the control of the potential of the first node and the potential of the second node.

Optionally, the output control circuit includes a first output control transistor and a second output control transistor; a control electrode of the first output control transistor is electrically connected to the first output control terminal, a first electrode of the first output control transistor is electrically connected to the signal output terminal, and a second electrode of the first output control transistor is electrically connected to the first voltage terminal; a control electrode of the second output control transistor is electrically connected to the second output control terminal, a first electrode of the second output control transistor is electrically connected to the second voltage terminal, and a second electrode of the second output control transistor is electrically connected to the signal writing-in terminal.

Optionally, the first output circuit includes a first output transistor and a second output transistor; a control electrode of the first output transistor is electrically connected to the first node, a first electrode of the first output transistor is electrically connected to the signal output terminal, and a second electrode of the first output transistor is electrically connected to the first voltage terminal; a control electrode of the second output transistor is electrically connected to the second node, a first electrode of the second output transistor is electrically connected to the signal writing-in terminal, and a second electrode of the second output transistor is electrically connected to the signal output terminal.

Optionally, the shift signal output circuit includes a first shift output transistor and a second shift output transistor; a control electrode of the first shift output transistor is electrically connected to the first node, a first electrode of the first shift output transistor is electrically connected to the shift signal output terminal, and a second electrode of the first shift output transistor is electrically connected to the first voltage terminal; a control electrode of the second shift output transistor is electrically connected to the second node, a first electrode of the second shift output transistor is electrically connected to the second voltage terminal, and a second electrode of the second shift output transistor is electrically connected to the shift signal output terminal.

Optionally, the transmission control circuit includes a first control node control circuit, a first input node control circuit, a first node control circuit, a first energy storage circuit and a second node control circuit; the first control node control circuit is configured to control to write a second voltage into a first control node under the control of the first clock signal, and to write the first clock signal into the first control node under the control of the potential of the second node; the first input node control circuit is configured to write the second clock signal into the first input node under the control of a potential of the first control node; a first terminal of the first energy storage circuit is electrically connected to the first control node, a second terminal of the first energy storage circuit is electrically connected to the first input node, and the first energy storage circuit is configured to control a potential of the first input node according to the potential of the first control node; the first node control circuit is configured to control the first input node to be electrically connected to the first node under the control of the second clock signal, and to write the first voltage into the first node under the control of the potential of the second node and maintain the potential of the first node; the second node control circuit is configured to write the input signal into the second node under the control of the first clock signal, and under the control of the second clock signal and the potential of the first control node, control the second node to be connected to the first voltage terminal, and control the potential of the second node according to the second clock signal.

Optionally, the first control node control circuit includes a first control transistor and a second control transistor; a control electrode of the first control transistor is electrically connected to the first clock signal terminal, a first electrode of the first control transistor is electrically connected to the second voltage terminal, and a second electrode of the first control transistor is electrically connected to the first control transistor node; a control electrode of the second control transistor is electrically connected to the second node, a first electrode of the second control transistor is electrically connected to the first clock signal terminal, and a second electrode of the second control transistor is electrically connected to the first control node; the first input node control circuit includes a third control transistor; a control electrode of the third control transistor is electrically connected to the first control node, a first electrode of the third control transistor is electrically connected to the first input node, and a second electrode of the third control transistor is electrically connected to the second clock signal terminal; the first energy storage circuit includes a first storage capacitor; a first terminal of the first storage capacitor is electrically connected to the first control node, and a second terminal of the first storage capacitor is electrically connected to the first input node; the first node control circuit includes a fourth control transistor, a fifth control transistor and a second storage capacitor; a control electrode of the fourth control transistor is electrically connected to the second clock signal terminal, a first electrode of the fourth control transistor is electrically connected to the first input node, and a second electrode of the fourth control transistor is electrically connected to the first node; a control electrode of the fifth control transistor is electrically connected to the second node, a first electrode of the fifth control transistor is electrically connected to the first voltage terminal, and a second electrode of the fifth control transistor is electrically connected to the first node; a first terminal of the second storage capacitor is electrically connected to the first node, and a second terminal of the second storage capacitor is electrically connected to the first voltage terminal.

Optionally, the second node control circuit includes a sixth control transistor, a seventh control transistor, an eighth control transistor and a third storage capacitor; a control electrode of the sixth control transistor is electrically connected to the first clock signal terminal, a first electrode of the sixth control transistor is electrically connected to the input terminal, and a second electrode of the sixth control transistor is electrically connected to the second node, the input terminal is used to provide an input signal; a control electrode of the seventh control transistor is electrically connected to the second clock signal terminal, and a first electrode of the seventh control transistor is electrically connected to the second node; a control electrode of the eighth control transistor is electrically connected to the first control node, a first electrode of the eighth control transistor is electrically connected to a second electrode of the seventh control transistor, and a second electrode of the eighth control transistor is electrically connected to the first voltage terminal; a first terminal of the third storage capacitor is electrically connected to the second node, and a second terminal of the third storage capacitor is electrically connected to the second clock signal terminal.

Optionally, the second node control circuit includes a sixth control transistor, a seventh control transistor, an eighth control transistor, a ninth control transistor, a tenth control transistor, a third control transistor storage capacitor and a fourth storage capacitor, wherein a control electrode of the sixth control transistor is electrically connected to the first clock signal terminal, a first electrode of the sixth control transistor is electrically connected to the input terminal, and a second electrode of the sixth control transistor is electrically connected to a third node, the input terminal is used to provide an input signal; a control electrode of the seventh control transistor is electrically connected to the second clock signal terminal, and a first electrode of the seventh control transistor is electrically connected to the second node; a control electrode of the eighth control transistor is electrically connected to the first control node, a first electrode of the eighth control transistor is electrically connected to a second electrode of the seventh control transistor, and a second electrode of the eighth control transistor is electrically connected to the first voltage terminal; a control electrode of the ninth control transistor and a first electrode of the ninth control transistor are electrically connected to the third node, and a second electrode of the ninth control transistor is electrically connected to the second node; a control electrode of the tenth control transistor is electrically connected to the second clock signal terminal, a first electrode of the tenth control transistor is electrically connected to the second node, and a second electrode of the tenth control transistor is electrically connected to the second electrode of the seventh control transistor; a first terminal of the third storage capacitor is electrically connected to the third node, and a second terminal of the third storage capacitor is electrically connected to the second clock signal terminal; a first terminal of the fourth storage capacitor is electrically connected to the second node, and a second terminal of the fourth storage capacitor is electrically connected to the second voltage terminal.

Optionally, the transmission control circuit includes a fourth node control circuit, a second node control circuit, a first node control circuit, and a fifth node control circuit, the fourth node control circuit is configured to write the second voltage into a fourth node under the control of the first clock signal, and write the first clock signal into the fourth node under the control of a potential of a fifth node; the fifth node control circuit is configured to write the input signal into the fifth node under the control of the first clock signal, and to maintain the potential of the fifth node; the second node control circuit is configured to write the input signal into the first node under the control of the first clock signal, and write the first voltage into the second node under the control of the second clock signal and the potential of the first node; the first node control circuit is configured to write the second clock signal into the first node under the control of the potential of the fourth node and the second clock signal, and to write the first voltage into the first node under the control of the potential of the second node.

Optionally, the fourth node control circuit includes an eleventh control transistor, a twelfth control transistor, and a thirteenth control transistor; a control electrode of the eleventh control transistor is electrically connected to the first clock signal terminal, a first electrode of the eleventh control transistor is electrically connected to the second voltage terminal, and a second electrode of the eleventh control transistor is electrically connected to the fourth node; a control electrode of the twelfth control transistor is electrically connected to the fifth node, and a first electrode of the twelfth control transistor is electrically connected to the first clock signal terminal; a control electrode of the thirteenth control transistor is electrically connected to the fifth node, a first electrode of the thirteenth control transistor is electrically connected to a second electrode of the twelfth control transistor, and a second electrode of the thirteenth control transistor is electrically connected to the fourth node; the first node control circuit includes a fourteenth control transistor, a fifteenth control transistor, a fifth storage capacitor, a second storage capacitor and a sixteenth control transistor, wherein, a control electrode of the fourteenth control transistor is electrically connected to the fourth node, and a second electrode of the fourteenth control transistor is electrically connected to the second clock signal terminal; a first terminal of the fifth storage capacitor is electrically connected to a second electrode of the fourteenth control transistor, and a second terminal of the fifth storage capacitor is electrically connected to the fourth node; a first terminal of the second storage capacitor is electrically connected to the first node, and a second terminal of the second storage capacitor is electrically connected to the first voltage terminal; a control electrode of the fifteenth control transistor is electrically connected to the second clock signal terminal, a first electrode of the fifteenth control transistor is electrically connected to the first node, and a second electrode of the fifteenth control transistor is electrically connected to the second electrode of the fourteenth control transistor; a control electrode of the sixteenth control transistor is electrically connected to the second node, a first electrode of the sixteenth control transistor is electrically connected to the first node, and a second electrode of the sixteenth control transistor is electrically connected to the first voltage terminal; the fifth node control circuit includes a seventeenth control transistor and a sixth storage capacitor, a control electrode of the seventeenth control transistor is electrically connected to the first clock signal terminal, a first electrode of the seventeenth control transistor is electrically connected to the input terminal, and a second electrode of the seventeenth control transistor is electrically connected to the fifth node; a first terminal of the sixth storage capacitor is electrically connected to the fifth node, and a second terminal of the sixth storage capacitor is electrically connected to the first voltage terminal.

Optionally, the second node control circuit includes an eighteenth control transistor, a nineteenth control transistor, a twentieth control transistor, and a seventh storage capacitor, wherein, a control electrode of the eighteenth control transistor is electrically connected to the first clock signal terminal, a first electrode of the eighteenth control transistor is electrically connected to the input terminal, and a second electrode of the eighteenth control transistor is electrically connected to the second node; a control electrode of the nineteenth control transistor is electrically connected to the fourth node, and a second electrode of the nineteenth control transistor is electrically connected to the first voltage terminal; a control electrode of the twentieth control transistor is electrically connected to the second clock signal terminal, a first electrode of the twentieth control transistor is electrically connected to the second node, and a second electrode of the twentieth control transistor is electrically connected to the first electrode of the nineteenth control transistor; a first terminal of the seventh storage capacitor is electrically connected to the second node, and a second terminal of the seventh storage capacitor is electrically connected to the second clock signal terminal.

Optionally, the second node control circuit includes an eighteenth control transistor, a nineteenth control transistor, a twentieth control transistor, a seventh storage capacitor, a twenty-first control transistor, a twenty-second control transistor, and an eighth storage capacitor, a control electrode of the eighteenth control transistor is electrically connected to the first clock signal terminal, a first electrode of the eighteenth control transistor is electrically connected to the input terminal, and a second electrode of the eighteenth control transistor is electrically connected to a sixth node; a control electrode of the twenty-second control transistor and a first electrode of the twenty-second control transistor are both electrically connected to the sixth node, and a second electrode of the twenty-second control transistor is electrically connected to the second node; a first terminal of the eighth storage capacitor is electrically connected to the sixth node, and a second terminal of the eighth storage capacitor is electrically connected to the second clock signal terminal; a control electrode of the nineteenth control transistor is electrically connected to the fourth node, and a second electrode of the nineteenth control transistor is electrically connected to the first voltage terminal; a control electrode of the twentieth control transistor is electrically connected to the second clock signal terminal, a first electrode of the twentieth control transistor is electrically connected to the sixth node, and a second electrode of the twentieth control transistor is electrically connected to a first electrode of the nineteenth control transistor; a control electrode of the twenty-first control transistor is electrically connected to the second clock signal terminal, a first electrode of the twenty-first control transistor is electrically connected to the second node, and a second electrode the twenty-first control transistor is electrically connected to the second electrode of the twentieth control transistor; a control electrode of the twenty-second control transistor and a first electrode of the twenty-second control transistor are both electrically connected to the sixth node, and a second electrode of the twenty-second control transistor is electrically connected to the second node; a first terminal of the seventh storage capacitor is electrically connected to the second node, and a second terminal of the seventh storage capacitor is electrically connected to the second voltage terminal.

In a second aspect, an embodiment of the present disclosure provides a signal generation method applied to the signal generation circuit, the signal generation method includes: controlling, by the transmission control circuit, the potential of the first node and the potential of the second node under the control of the first clock signal, the second clock signal and the input signal; controlling, by the first output circuit, the signal output terminal to be connected to the first voltage terminal under the control of the potential of a first node, and the signal output terminal to be connected to the signal writing-in terminal under the control of the potential of the second node; controlling, by the output control circuit, the signal writing-in terminal to be connected to the second voltage terminal under the control of the second output control signal, and the signal output terminal to be connected to the first voltage terminal under the control of the first output control signal.

In a third aspect, an embodiment of the present disclosure provides a signal generation module including a plurality of stages of signal generation circuits.

Optionally, in addition to a first stage of signal generation circuit, an input terminal included in each stage of the signal generation circuit is electrically connected to a signal output terminal of an adjacent previous stage of shift register unit.

Optionally, the signal generating circuit further includes a shift signal output terminal; in addition to a first stage of signal generating circuit, an input terminal included in each stage of signal generating circuit is electrically connected to a shift signal output terminal of an adjacent previous stage of shift register unit.

In a fourth aspect, an embodiment of the present disclosure provides a display device including the signal generating module.

DETAILED DESCRIPTION

The technical solutions in the embodiments of the present disclosure will be clearly and completely described below with reference to the accompanying drawings in the embodiments of the present disclosure. Obviously, the described embodiments are only a part of the embodiments of the present disclosure, but not all of the embodiments. Based on the embodiments in the present disclosure, all other embodiments obtained by those of ordinary skill in the art without creative work shall fall within the protection scope of the present disclosure.

The transistors used in all the embodiments of the present disclosure may be triodes, thin film transistors, field effect transistors, or other devices with the same characteristics. In the embodiments of the present disclosure, in order to distinguish the two electrodes of the transistor other than the control electrode, one electrode is called the first electrode, and the other electrode is called the second electrode.

In actual operation, when the transistor is a triode, the control electrode may be the base electrode, the first electrode may be the collector, and the second electrode may be the emitter; or the control electrode may be the base electrode, the first electrode can be an emitter, and the second electrode can be a collector.

In actual operation, when the transistor is a thin film transistor or a field effect transistor, the control electrode may be a gate electrode, the first electrode may be a drain electrode, and the second electrode may be a source electrode; or the control electrode may be a gate electrode, the first electrode may be a source electrode, and the second electrode may be a drain electrode.

Figure 1:
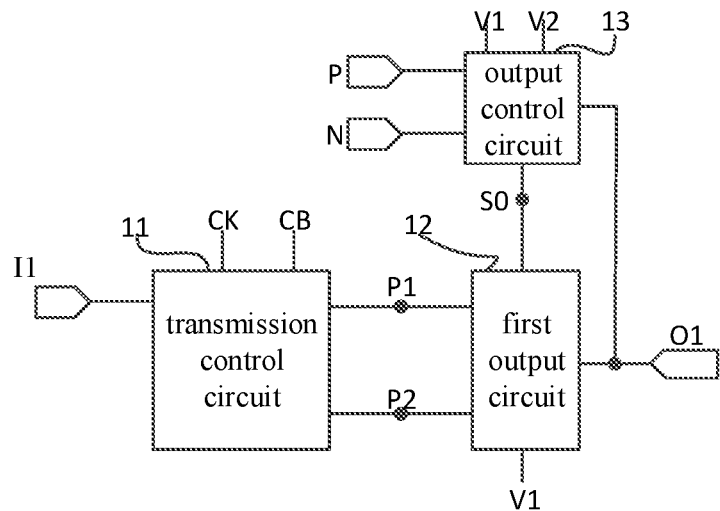
FIG. 1 is a structural diagram of a signal generating circuit according to an embodiment of the present disclosure.

As shown in FIG. 1, the signal generation circuit described in the embodiment of the present disclosure includes an input terminal I1, a signal output terminal O1, a transmission control circuit 11, a first output circuit 12, and an output control circuit 13;

The transmission control circuit 11 is electrically connected to the input terminal I1, a first node P1, a second node P2, a first clock signal terminal and a second clock signal terminal, respectively, and is configured to control the potential of the first node P1 and the potential of the second node P2 under the control of the first clock signal CK, the second clock signal CB and the input signal; the first clock signal terminal is used to provide the first clock signal CK, and the second clock signal terminal is used to provide the second clock signal CB, the input terminal I1 is used to provide the input signal;

The first output circuit 12 is respectively electrically connected with a signal writing-in terminal S0, the first node P1, the second node P2, a first voltage terminal V1 and a signal output terminal O1, and is configured to connect the signal output terminal S0 and the first voltage terminal V1 under the control of the potential of the first node P1, and under the control of the potential of the second node P2, control to connect the control signal output terminal S0 and the signal writing-in terminal S0;

The output control circuit 13 is respectively electrically connected with the first output control terminal N, the second output control terminal P, the second voltage terminal V2, the signal writing-in terminal S0, the signal output terminal O1 and the first voltage terminal V1, configured to control to connect the signal writing-in terminal S0 and the second voltage terminal V2 under the control of a second output control signal provided by a second output control terminal P, and control to connect the signal output terminal O1 and the first voltage terminal V1 under the control of the first output control signal provided by the first output control terminal N.

The signal generating circuit described in the embodiment of the present disclosure adopts the output control circuit 13, and under the control of the second output control signal provided by the second output control terminal P and the first output control signal provided by the first output control terminal N, controls the signal output terminal O1 to outputs a Pulse Width Modulation (PWM) signal, and the frequency and duty cycle of the PWM signal can be freely adjusted. At high frequencies, the frequency of the PWM signal can be higher than the pixel charging line frequency. At low frequencies, the frequency of the PWM signal can be the same as the frame frequency, which greatly expands the adjustment range.

When the signal generating circuit described in at least one embodiment of the present disclosure is in operation, the signal shift is performed by the transmission control circuit 11, and the adjustment of the frequency and duty cycle of the PWM signal is performed by the output control circuit 13. When the second output control signal is a valid control signal, the output control circuit 13 controls the signal writing-in terminal S0 to connect to the second voltage. If the potential of the second node P2 is a valid potential at this time, O1 outputs the second voltage; when the first output control signal is a valid control signal, the output control circuit 13 controls the signal output terminal O1 to output the first voltage.

In at least one embodiment of the present disclosure, the PWM signal may be a light emitting control signal, but is not limited thereto.

In at least one embodiment of the present disclosure, the valid control signal is a voltage signal capable of turning on a transistor when the gate electrode of the transistor is connected to the voltage signal, and the valid potential is a potential capable of turning on a transistor when the gate electrode of the transistor is connected to the potential.

In a specific implementation, the first output control signal and the second output control signal may be mutually inverse in phase, but not limited to this.

In at least one embodiment of the present disclosure, the first voltage provided by the first voltage terminal may be a high voltage, and the second voltage provided by the second voltage terminal may be a low voltage, but not limited thereto.

Figure 2:
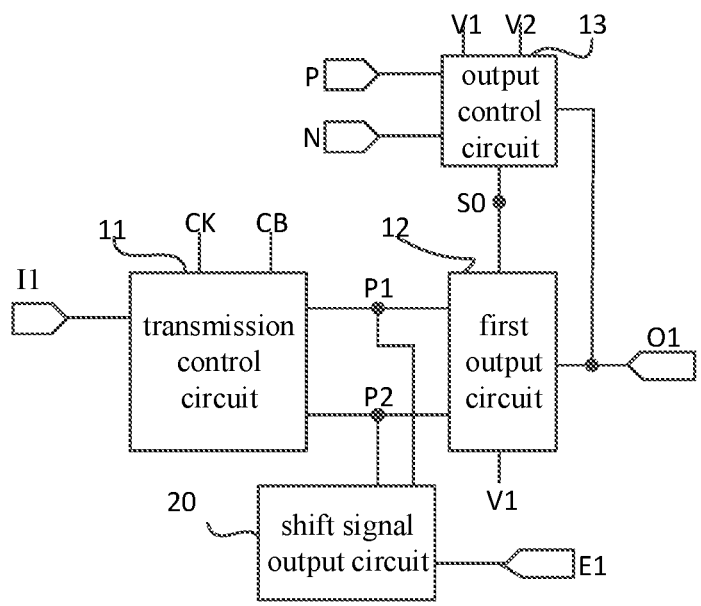
FIG. 2 is a structural diagram of a signal generating circuit according to at least one embodiment of the present disclosure.

During specific implementation, as shown in FIG. 2, on the basis of the signal generation circuit shown in FIG. 1, the signal generation circuit described in at least one embodiment of the present disclosure may further include a shift signal output terminal E1 and a shift signal output circuit 20;

The shift signal output circuit 20 is electrically connected to the first node P1, the second node P2 and the shift signal output terminal E1 respectively, and is configured to control the shift signal output terminal E1 to output the shift signal under the control of the potential of the first node P1 and the potential of the second node P2.

The signal generating circuit according to at least one embodiment of the present disclosure may further include a shift signal output circuit 20 to control the shift signal output terminal E1 to output the shift signal, and provide the input signal to the input terminal of an adjacent next stage of signal generating circuit through the shift signal. The signal generation circuit described in at least one embodiment of the present disclosure separates the output of the shift signal from the output of the PWM signal, which is beneficial to realize high-frequency PWM control.

Optionally, the output control circuit may include a first output control transistor and a second output control transistor;

The control electrode of the first output control transistor is electrically connected to the first output control terminal, the first electrode of the first output control transistor is electrically connected to the signal output terminal, and the second electrode of the first output control transistor is electrically connected to the first voltage terminal;

The control electrode of the second output control transistor is electrically connected to the second output control terminal, the first electrode of the second output control transistor is electrically connected to the second voltage terminal, and the second electrode of the second output control transistor is electrically connected to the signal writing-in terminal.

Optionally, the first output circuit may include a first output transistor and a second output transistor;

The control electrode of the first output transistor is electrically connected to the first node, the first electrode of the first output transistor is electrically connected to the signal output terminal, and the second electrode of the first output transistor is electrically connected to the first voltage terminal;

The control electrode of the second output transistor is electrically connected to the second node, the first electrode of the second output transistor is electrically connected to the signal writing-in terminal, and the second electrode of the second output transistor is electrically connected to the signal output terminal.

Figure 3:
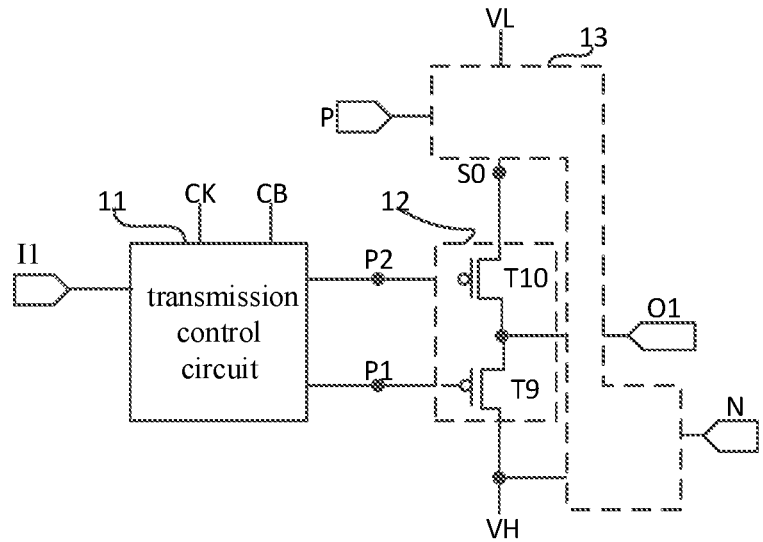
FIG. 3 is a structural diagram of a signal generating circuit according to at least one embodiment of the present disclosure.

As shown in FIG. 3, on the basis of the embodiment of the signal generating circuit shown in FIG. 1, the output control circuit 13 includes a first output control transistor T11 and a second output control transistor T12;

A gate electrode of the first output control transistor T12 is electrically connected to the first output control terminal N, a source electrode of the first output control transistor T12 is electrically connected to the signal output terminal O1, and a drain electrode of the first output control transistor T12 is electrically connected to the high voltage terminal; the high voltage terminal is used to provide the high voltage VH.

A gate electrode of the second output control transistor T11 is electrically connected to the second output control terminal P, a source electrode of the second output control transistor T11 is electrically connected to the low voltage terminal, and a drain electrode of the second output control transistor T11 is electrically connected to the signal writing-in terminal S0; the low voltage terminal is used to provide the low voltage VL;

The first output circuit 12 includes a first output transistor T9 and a second output transistor T10;

A gate electrode of the first output transistor T9 is electrically connected to the first node P1, a source electrode of the first output transistor T9 is electrically connected to the signal output terminal O1, and a drain electrode of the first output transistor T9 is electrically connected to the high voltage terminal;

A gate electrode of the second output transistor T10 is electrically connected to the second node P2, a source electrode of the second output transistor T10 is electrically connected to the signal writing-in terminal S0, and a drain electrode of the second output transistor T10 is electrically connected to the signal output terminal O1.

In at least one embodiment shown in FIGS. 3, T11, T12, T9 and T10 may be p-type thin film transistors, but not limited thereto.

When at least one embodiment of the present disclosure as shown in FIG. 3 is in operation, when the potential of P1 is a low voltage, T9 is turned on, and O1 is connected to VH; when the potential of N is a low voltage, O1 is connected to VL;

When the potential of P2 is a low voltage and the potential of P is a low voltage, O1 is connected to VL. In at least one embodiment of the present disclosure, the high voltage VH may be the first high voltage VDD or the second high voltage VGH, and the low voltage VL may be the first low voltage VSS or the second low voltage VGL, but this is not limited.

Optionally, the shift signal output circuit includes a first shift output transistor and a second shift output transistor;

A control electrode of the first shift output transistor is electrically connected to the first node, a first electrode of the first shift output transistor is electrically connected to the shift signal output terminal, and a second electrode of the first shift output transistor is electrically connected to the first voltage terminal;

A control electrode of the second shift output transistor is electrically connected to the second node, a first electrode of the second shift output transistor is electrically connected to the second voltage terminal, and a second electrode of the second shift output transistor is electrically connected to the shift signal output terminal.

According to a specific embodiment, the transmission control circuit may include a first control node control circuit, a first input node control circuit, a first node control circuit, a first energy storage circuit and a second node control circuit;

The first control node control circuit is used to control to write the second voltage into the first control node under the control of the first clock signal, and to write the first clock signal into the first control node under the control of the potential of the second node;

The first input node control circuit is configured to write a second clock signal into the first input node under the control of the potential of the first control node;

The first terminal of the first energy storage circuit is electrically connected to the first control node, the second terminal of the first energy storage circuit is electrically connected to the first input node, and the first energy storage circuit is configured to control the potential of the first input node according to the potential of the first control node;

The first node control circuit is used to control the first input node to be electrically connected to the first node under the control of the second clock signal, and to write the first voltage into the first node under the control of the potential of the second node and maintain the potential of the first node;

The second node control circuit is used to write the input signal into the second node under the control of the first clock signal, and under the control of the second clock signal and the potential of the first control node, control the second node to be connected to the first voltage terminal, and control the potential of the second node according to the second clock signal.

In at least one embodiment of the present disclosure, the first voltage terminal may be a high voltage terminal, and the second voltage terminal may be a low voltage terminal, but not limited thereto.

In a specific implementation, the transmission control circuit may include a first control node control circuit, a first input node control circuit, a first node control circuit, a first energy storage circuit and a second node control circuit, the first control node control circuit controls the potential of the first control node, the first input node control circuit controls the potential of the first input node, the first energy storage circuit controls the potential of the first input node according to the potential of the first control node, and the first node control circuit controls the potential of the first node, the second node control circuit controls the potential of the second node.

Figure 4:
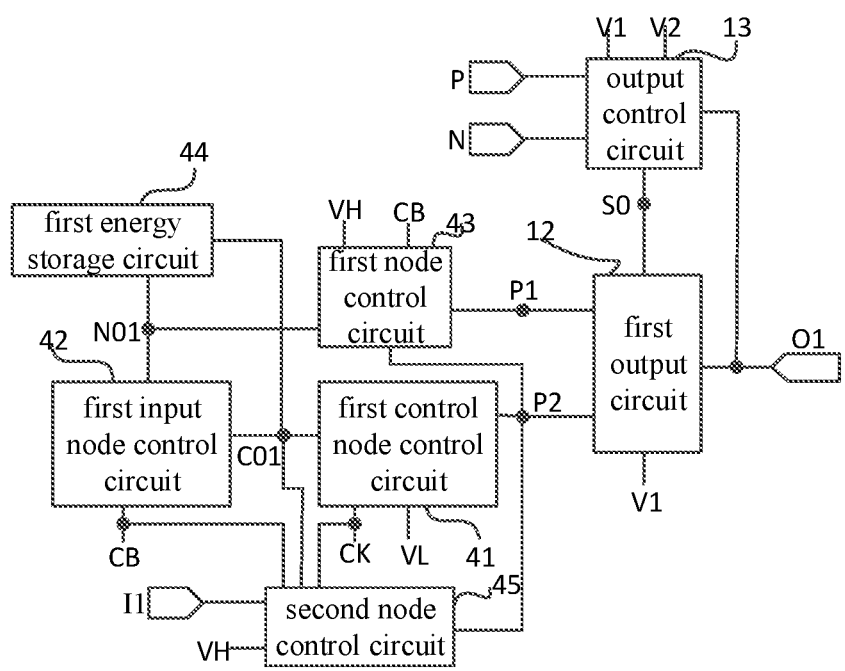
FIG. 4 is a structural diagram of a signal generating circuit according to at least one embodiment of the present disclosure.

As shown in FIG. 4, on the basis of the embodiment of the signal generating circuit shown in FIG. 1, the transmission control circuit may include a first control node control circuit 41, a first input node control circuit 42, a first node control circuit 43, a first energy storage circuit 44 and a second node control circuit 45;

The first control node control circuit 41 is respectively electrically connected to the first clock signal terminal, the low voltage terminal, the first control node C01 and the second node P2, and is used to control to write the low voltage VL into the first control node C01 under the control of the first clock signal CK, and under the control of the potential of the second node P2, the first clock signal CK is written into the first control node C01; the first clock signal terminal is used to provide the first clock signal CK, the low voltage terminal is used to provide the low voltage VL;

The first input node control circuit 42 is respectively electrically connected to the first control node C01, the second clock signal terminal and the first input node N01, and is used to write the clock signal CB into the first input node N01 under the control of the potential of the first control node C01;

The first terminal of the first energy storage circuit 44 is electrically connected to the first control node C01, the second terminal of the first energy storage circuit 44 is electrically connected to the first input node N01, and the first energy storage circuit 44 is used to control the potential of the first input node N01 according to the potential of the first control node C01;

The first node control circuit 43 is respectively electrically connected to the second clock signal terminal, the first input node N01, the first node P1, the second node P2 and the high voltage terminal, and is used to, under the control of the second clock signal CB, control the first input node N01 to be electrically connected to the first node P1, and is used to write the high voltage VH into the first node P1 under the control of the potential of the second node P2, and to maintain the potential of the first node P1; the second clock signal terminal is used to provide the second clock signal CB, and the high voltage terminal is used to provide the high voltage VH;

The second node control circuit 45 is respectively electrically connected to the first clock signal terminal, the input terminal I1, the second node P2, the second clock signal terminal, the first control node C01 and the high voltage terminal, and is used to write the input signal into the second node P2 under the control of the first clock signal CK, and under the control of the second clock signal CB and the potential of the first control node C01, control the connection between the second node P2 and the high voltage terminal, and control the potential of the second node P2 according to the second clock signal CB; the input terminal I1 is used to provide the input signal.

Optionally, the first control node control circuit includes a first control transistor and a second control transistor;

A control electrode of the first control transistor is electrically connected to the first clock signal terminal, a first electrode of the first control transistor is electrically connected to the second voltage terminal, and a second electrode of the first control transistor is electrically connected to the first control transistor node;

A control electrode of the second control transistor is electrically connected to the second node, a first electrode of the second control transistor is electrically connected to the first clock signal terminal, and a second electrode of the second control transistor is electrically connected to the first control node;

the first input node control circuit includes a third control transistor;

A control electrode of the third control transistor is electrically connected to the first control node, a first electrode of the third control transistor is electrically connected to the first input node, and a second electrode of the third control transistor is electrically connected to the second clock signal terminal;

the first energy storage circuit includes a first storage capacitor;

A first terminal of the first storage capacitor is electrically connected to the first control node, and a second terminal of the first storage capacitor is electrically connected to the first input node;

the first node control circuit includes a fourth control transistor, a fifth control transistor and a second storage capacitor;

A control electrode of the fourth control transistor is electrically connected to the second clock signal terminal, a first electrode of the fourth control transistor is electrically connected to the first input node, and a second electrode of the fourth control transistor is electrically connected to the first node;

A control electrode of the fifth control transistor is electrically connected to the second node, a first electrode of the fifth control transistor is electrically connected to the first voltage terminal, and a second electrode of the fifth control transistor is electrically connected to the first node;

A first terminal of the second storage capacitor is electrically connected to the first node, and a second terminal of the second storage capacitor is electrically connected to the first voltage terminal.

Optionally, the second node control circuit includes a sixth control transistor, a seventh control transistor, an eighth control transistor and a third storage capacitor;

A control electrode of the sixth control transistor is electrically connected to the first clock signal terminal, a first electrode of the sixth control transistor is electrically connected to the input terminal, and a second electrode of the sixth control transistor is electrically connected to the second node, the input terminal is used to provide an input signal;

A control electrode of the seventh control transistor is electrically connected to the second clock signal terminal, and a first electrode of the seventh control transistor is electrically connected to the second node;

A control electrode of the eighth control transistor is electrically connected to the first control node, a first electrode of the eighth control transistor is electrically connected to the second electrode of the seventh control transistor, and a second electrode of the eighth control transistor is electrically connected to the first voltage terminal;

A first terminal of the third storage capacitor is electrically connected to the second node, and a second terminal of the third storage capacitor is electrically connected to the second clock signal terminal.

Figure 5:
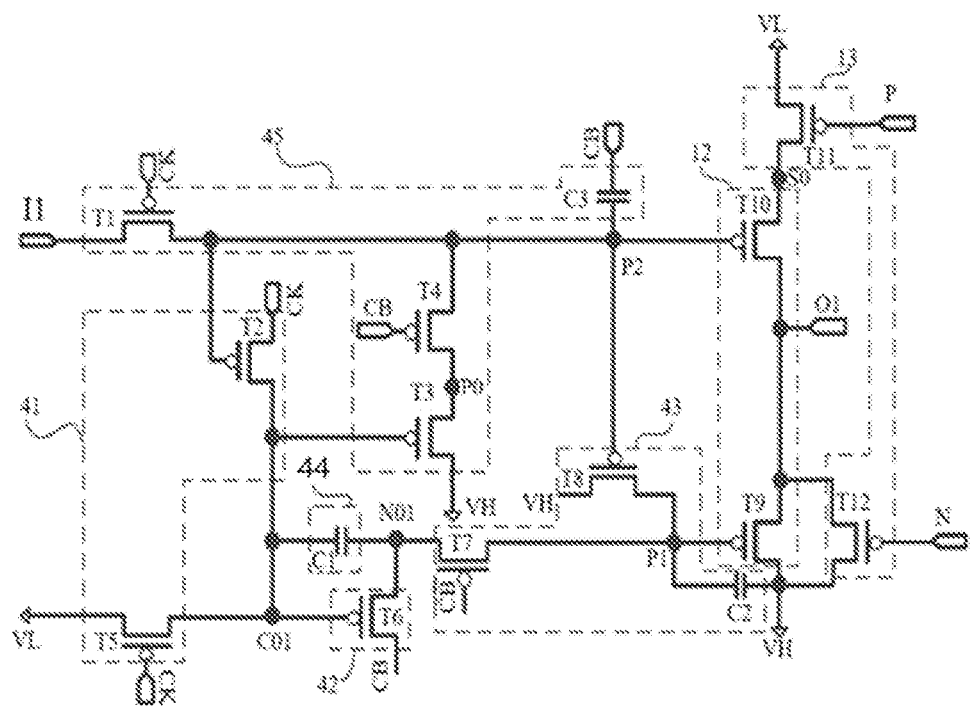
FIG. 5 is a circuit diagram of the signal generation circuit according to at least one embodiment of the present disclosure.

As shown in FIG. 5, at least one embodiment of the signal generation circuit described in the present disclosure includes an input terminal I1, a signal output terminal O1, a transmission control circuit, a first output circuit 12, and an output control circuit 13;

The output control circuit 13 includes a first output control transistor T11 and a second output control transistor T12;

The gate electrode of the first output control transistor T12 is electrically connected to the first output control terminal N, the source electrode of the first output control transistor T12 is electrically connected to the signal output terminal, and the drain electrode of first output control transistor T12 is electrically connected to the high voltage terminal; the high voltage terminal is used to provide the high voltage VH;

The gate electrode of the second output control transistor T11 is electrically connected to the second output control terminal P, the source electrode of the second output control transistor T11 is electrically connected to the low voltage terminal, and the drain electrode of the second output control transistor T11 is electrically connected to the signal writing-in terminal S0; the low voltage terminal is used to provide the low voltage VL;

The first output circuit 12 includes a first output transistor T9 and a second output transistor T10;

The gate electrode of the first output transistor T9 is electrically connected to the first node P1, the source electrode of the first output transistor T9 is electrically connected to the signal output terminal O1, and the drain electrode of the first output transistor T9 is electrically connected to the high voltage terminal;

The gate electrode of the second output transistor T10 is electrically connected to the second node P2, the source electrode of the second output transistor T10 is electrically connected to the signal writing-in terminal S0, and the drain electrode of the second output transistor T10 is electrically connected to the signal output terminal O1;

The transmission control circuit includes a first control node control circuit 41, a first input node control circuit 42, a first node control circuit 43, a first energy storage circuit 44 and a second node control circuit 45;

The first control node control circuit 41 includes a first control transistor T5 and a second control transistor T2;

The gate electrode of the first control transistor T5 is electrically connected to the first clock signal terminal, the source electrode of the first control transistor T5 is electrically connected to the low voltage terminal, and the drain electrode of the first control transistor T5 is electrically connected to the first control node C01; the first clock signal terminal is used to provide the first clock signal CK, and the low voltage terminal is used to provide the low voltage VL;

The gate electrode of the second control transistor T2 is electrically connected to the second node P2, the source electrode of the second control transistor T2 is electrically connected to the first clock signal terminal, and the drain electrode of the second control transistor T2 is electrically connected to the first control node C01;

The first input node control circuit 42 includes a third control transistor T6;

The gate electrode of the third control transistor T6 is electrically connected to the first control node C01, the source electrode of the third control transistor T6 is electrically connected to the first input node N01, and the drain electrode of the third control transistor T6 is electrically connected to the second clock signal terminal; the second clock signal terminal is used for providing the second clock signal CB;

The first energy storage circuit 44 includes a first storage capacitor C1;

The first terminal of the first storage capacitor C1 is electrically connected to the first control node C01, and the second terminal of the first storage capacitor C1 is electrically connected to the first input node N01;

The first node control circuit 43 includes a fourth control transistor T7, a fifth control transistor T8 and a second storage capacitor C2;

The gate electrode of the fourth control transistor T7 is electrically connected to the second clock signal terminal, the source electrode of the fourth control transistor T7 is electrically connected to the first input node N01, and the drain electrode of the fourth control transistor T7 is electrically connected to the first node P1;

The gate electrode of the fifth control transistor T8 is electrically connected to the second node P2, the source electrode of the fifth control transistor T8 is electrically connected to the high voltage terminal, and the drain electrode of the fifth control transistor T8 is electrically connected to the first node P1; the high voltage terminal is used to provide the high voltage VH;

The first terminal of the second storage capacitor C2 is electrically connected to the first node P1, and the second terminal of the second storage capacitor C2 is electrically connected to the high voltage terminal.

The second node control circuit 45 includes a sixth control transistor T1, a seventh control transistor T4, an eighth control transistor T3 and a third storage capacitor C3;

The gate electrode of the sixth control transistor T1 is electrically connected to the first clock signal terminal, the source electrode of the sixth control transistor T1 is electrically connected to the input terminal I1, and the drain electrode of the sixth control transistor T1 is electrically connected to the second node P2, and the input terminal I1 is used to provide an input signal;

The gate electrode of the seventh control transistor T4 is electrically connected to the second clock signal terminal, and the source electrode of the seventh control transistor T4 is electrically connected to the second node P2; the second clock signal terminal is used to provide the second clock signal CB;

The gate electrode of the eighth control transistor T3 is electrically connected to the first control node C01, the source electrode of the eighth control transistor T3 is electrically connected to the drain electrode of the seventh control transistor T4, and the drain electrode of the eighth control transistor T3 is electrically connected to the high voltage terminal; the high voltage terminal is used to provide the high voltage VH;

The first terminal of the third storage capacitor C3 is electrically connected to the second node P2, and the second terminal of the third storage capacitor C3 is electrically connected to the second clock signal terminal; the second clock signal terminal is used to provide the second clock signal CB.

In FIG. 5, P0 is the first connection node, and P0 is electrically connected to the source electrode of T3.

In at least one embodiment of the signal generating circuit shown in FIG. 5, all the embodiments are p-type thin film transistors, but not limited thereto.

Figure 6:
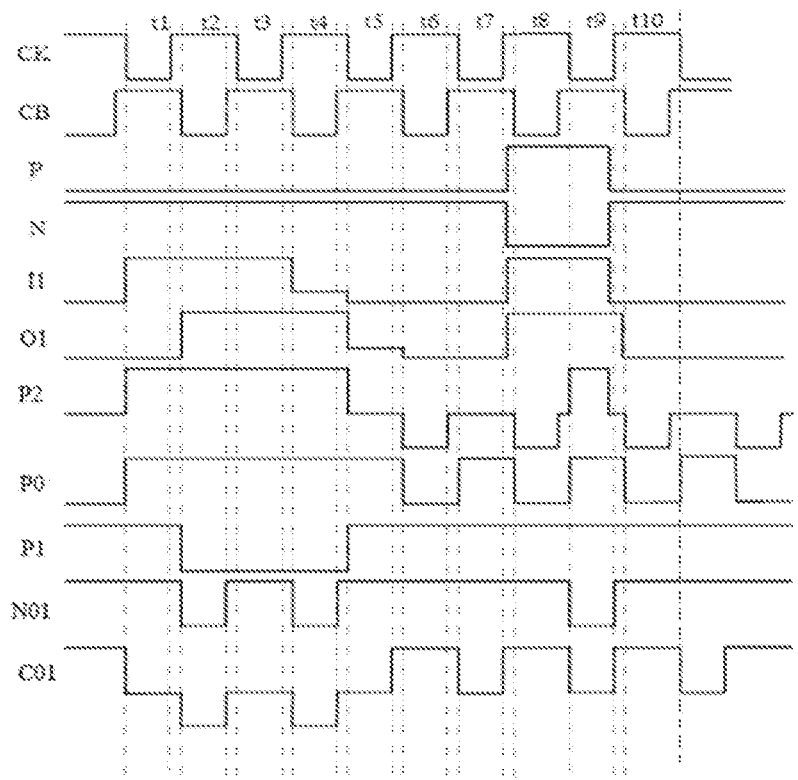
FIG. 6 is a working timing diagram of the signal generating circuit according to at least one embodiment of the present disclosure as shown in FIG. 5.

As shown in FIG. 6, when at least one embodiment of the signal generating circuit shown in FIG. 5 is working, In a first phase t1, CK is a low voltage, CB is a high voltage, the potential of P is a low voltage, the potential of N is a high voltage, I1 provides a high voltage, T1 and T5 are turned on, the potential of P2 is a high voltage, and the potential of C01 is a low voltage, T6 is turned on, the potential of N01 is a high voltage, T7 is turned off, T8 is turned off, the potential of P1 is maintained at high voltage, T3 is turned on, the potential of P0 is a high voltage, T4 is turned off, T11 is turned on, the potential of S0 is a low voltage, T10 is turned off, T9 is turned off, T12 is turned off, and O1 continues to output a low voltage;

In a second phase t2, CK is a high voltage, CB is a low voltage, the potential of P is a low voltage, the potential of N is a high voltage, I1 provides a high voltage, T1 and T5 are turned off, and T6 is turned on, so that the potential of N01 is a low voltage, T7 is turned on, the potential of P1 is a low voltage, T9 is turned on, T12 is turned off, T3 and T4 are both turned on, the potential of P0 is a high voltage, the potential of P2 is a high voltage, T10 is turned off, T11 is turned on, the potential of S0 is a low voltage, O1 outputs a high voltage;

In a third phase t3, CK is a low voltage, CB is a high voltage, the potential of P is a low voltage, the potential of N is a high voltage, I1 provides a high voltage, T1 and T5 are turned on, the potential of C01 is a low voltage, T6 is turned on, the potential of N01 is a high voltage, T7 is turned off, the potential of P2 is a high voltage, T2 is turned off, T3 is turned off, the potential of P1 is maintained at low voltage, T9 is turned on, T11 is turned on, the potential of S0 is a low voltage, T10 is turned off, T12 is turned off, O1 outputs a high voltage;

In a fourth phase t4, CK is a high voltage, CB is a low voltage, the potential of P is a low voltage, the potential of N is a high voltage, I1 provides a low voltage, T1 and T5 are turned off, the potential of C01 is a low voltage, T6 is turned on, the potential of N01 is a low voltage, T7 is turned on, the potential of P1 is a low voltage, T9 is turned on, T12 is turned off, both T3 and T4 are turned on, the potential of P2 is a high voltage, T10 is turned off, the potential of S0 is a low voltage, O1 outputs a high voltage;

In a fifth phase t5, CK is a low voltage, CB is a high voltage, the potential of P is a low voltage, the potential of N is a high voltage, I1 provides a low voltage, T1 and T5 are turned on, the potential of C01 is a low voltage, T6 is turned on, the potential of N01 is a high voltage, T7 is turned off, the potential of P2 is pulled down, T8 is turned on, the potential of P1 is a high voltage, T10 is turned on, T11 is turned on, the potential of S0 is a low voltage, T9 is turned off, T12 is turned off, O1 outputs a low voltage;

In a sixth phase t6, CK is a high voltage, CB is a low voltage, the potential of P is a low voltage, the potential of N is a high voltage, I1 provides a low voltage, T1 and T5 are turned off, the potential of P2 is a low voltage, T2 is turned on, so that the potential of C01 is a high voltage, T4 is turned on, T3 is turned off, T6 is turned off, the potential of N01 is a high voltage, T7 is turned on, the potential of P1 is a high voltage, T10 is turned on, T11 is turned on, the potential of S0 is a low voltage, T9 and T12 are turned off, O1 outputs a low voltage;

In a seventh phase t7, CK is a low voltage, CB is a high voltage, the potential of P is a low voltage, the potential of N is a high voltage, I1 provides a low voltage, T1 and T5 are turned on, the potential of P2 is a low voltage, and the potential of C01 is a low voltage, T6 is turned on, the potential of N01 is a high voltage, T7 is turned off, T2 is turned on, and T8 is turned on, so that the potential of P1 is a high voltage, T9 is turned off, T12 is turned off, T10 is turned on, T11 is turned on, and O1 outputs a low voltage;

In an eighth phase t8, CK is a high voltage, CB is a low voltage, the potential of P is a high voltage, the potential of N is a low voltage, T1 and T5 are turned off, and the potential of CP2 is reduced to enable the potential of P2 to be a low voltage through C3, T2 is turned on, so that the potential of C01 is a high voltage, T6 is turned off, C1 maintains the potential of N01 to be a high voltage, T7 is turned on, the potential of P1 is a high voltage, T9 is turned off, T12 is turned on, T11 is turned off, and O1 outputs a high voltage;

In a ninth phase t9, CK is a low voltage, CB is a high voltage, the potential of P is a high voltage, the potential of N is a low voltage, I1 provides a high voltage, T1 and T5 are turned on, the potential of P2 is a high voltage, and the potential of C01 is a low voltage, T6 is turned on, the potential of N01 is a high voltage, T7 is turned off, T10 is turned off, T11 is turned off, the potential of P1 is maintained at a high voltage, T12 is turned on, T9 is turned off, and O1 outputs a high voltage;

In a tenth phase t10, CK is a high voltage, CB is a low voltage, the potential of P is a low voltage, the potential of N is a high voltage, I1 provides a low voltage, both T1 and T5 are turned off, the potential of CP2 drops, and the potential of P2 is controlled by C3 to be a low voltage, T2 is turned on, the potential of C01 is a high voltage, the potential of N01 is a high voltage, T7 is turned on, the potential of P1 is a high voltage, T10 is turned on, T11 is turned on, T9 is turned off, T12 is turned off, and O1 outputs a low voltage.

Figure 7:
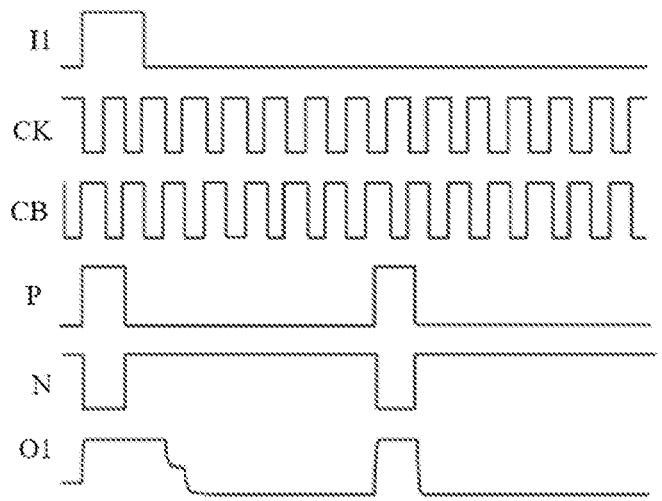
FIG. 7 is another working timing diagram of the signal generating circuit according to at least one embodiment of the present disclosure as shown in FIG. 5 when the frequency of the first output control signal and the frequency of the second output control signal are less than the frequency of the first clock signal.

When the frequency of the first output control signal and the frequency of the second output control signal are less than the frequency of the first clock signal, the waveform of the signal outputted by O1 may be as shown in FIG. 7.

In FIG. 7, the first clock signal is labeled CK, the second clock signal is labeled CB, the waveform corresponding to P is the waveform of the first output control signal, and the waveform corresponding to N is the waveform of the second output control signal, the waveform corresponding to O1 is the waveform of a signal outputted by O1.

In FIG. 7, the waveform of the input signal corresponds to I1.

Figure 8:
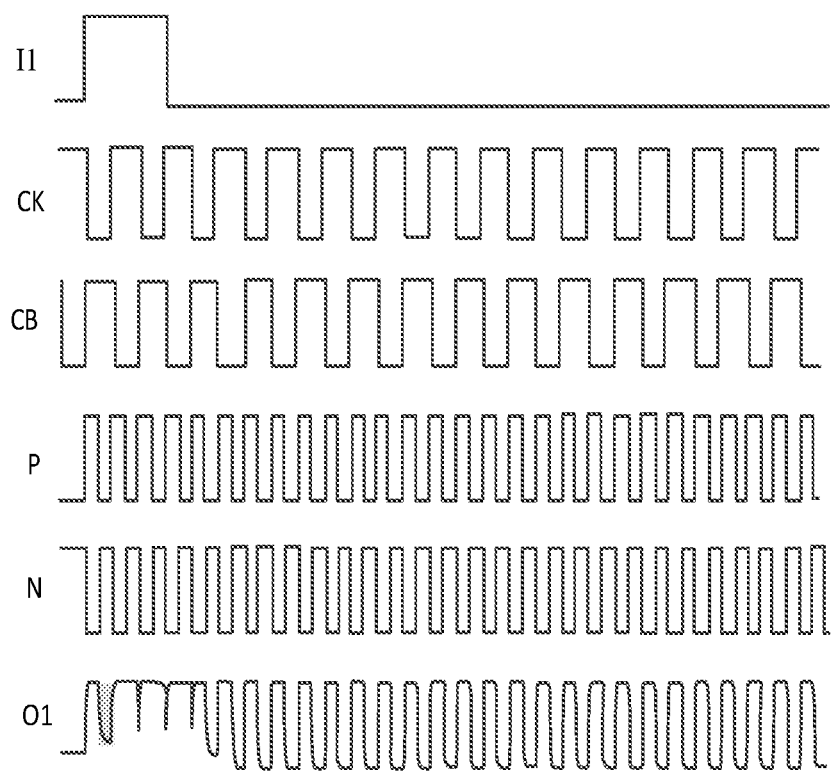
FIG. 8 is another working timing diagram of the signal generating circuit according to of at least one embodiment of the present disclosure as shown in FIG. 5 when the frequency of the first output control signal and the frequency of the second output control signal are less than the frequency of the first clock signal.

When the frequency of the first output control signal and the frequency of the second output control signal are greater than the frequency of the first clock signal, the waveform of the signal outputted by O1 may be as shown in FIG. 8.

In FIG. 8, the first clock signal is labeled CK, the second clock signal is labeled CB, the waveform corresponding to P is the waveform of the first output control signal, and the waveform corresponding to N is the waveform of the second output control signal, the waveform corresponding to O1 is the waveform of the signal outputted by O1.

In FIG. 8, the waveform of the input signal corresponds to I1.

Figure 9:
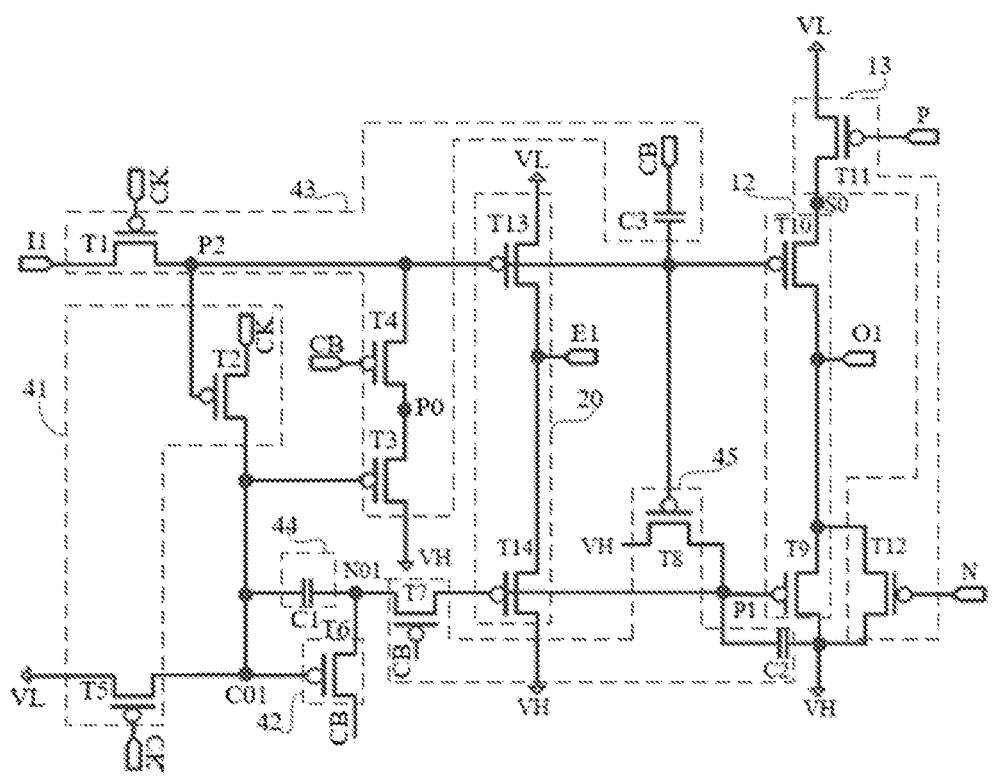
FIG. 9 is a circuit diagram of the signal generation circuit according to at least one embodiment of the present disclosure.

As shown in FIG. 9, on the basis of the signal generating circuit shown in FIG. 5, the signal generating circuit described in at least one embodiment of the present disclosure further includes a shift signal output terminal E1 and a shift signal output circuit 20;

The shift signal output circuit 20 includes a first shift output transistor T14 and a second shift output transistor T13;

A gate electrode of the first shift output transistor T14 is electrically connected to the first node P1, a source electrode of the first shift output transistor T14 is electrically connected to the shift signal output terminal 31, a drain electrode of the first shift output transistor T14 is electrically connected to the high voltage terminal; the high voltage terminal is used to provide the high voltage VH;

A gate electrode of the second shift output transistor T13 is electrically connected to the second node P2, a source electrode of the second shift output transistor T13 is electrically connected to the low voltage terminal, and a drain electrode of the second shift output transistor T13 is electrically connected to the shift signal output terminal E1; the low voltage terminal is used to provide the low voltage VL.

In at least one embodiment shown in FIG. 9, all the transistors are p-type thin film transistors, but not limited thereto.

Figure 10:
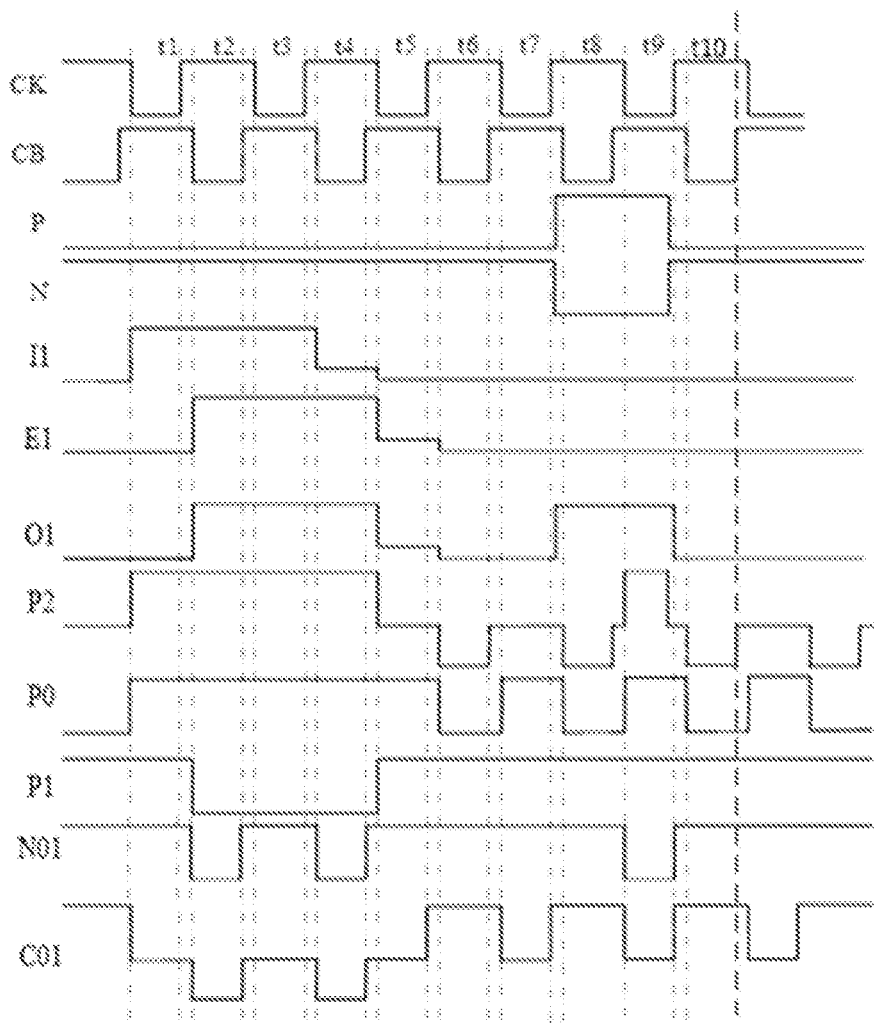
FIG. 10 is a working timing diagram of the signal generating circuit according to at least one embodiment of the present disclosure shown in FIG. 9.

As shown in FIG. 10, when the signal generating circuit shown in FIG. 9 is in operation, In the first phase t1, CK is a low voltage, CB is a high voltage, the potential of P is a low voltage, the potential of N is a high voltage, I1 provides a high voltage, T1 and T5 are turned on, the potential of P2 is a high voltage, and the potential of C01 is a low voltage, T6 is turned on, the potential of N01 is a high voltage, T7 is turned off, T8 is turned off, the potential of P1 is maintained at a high voltage, T3 is turned on, the potential of P0 is a high voltage, T4 is turned off, T11 is turned on, the potential of S0 is a low voltage, T10 is turned off, T9 is turned off, T12 is turned off, O1 continues to output a low voltage; T14 is turned off, T13 is turned off, and the potential of the shift signal outputted by E1 is maintained at a low voltage;

In the second phase t2, CK is a high voltage, CB is a low voltage, the potential of P is a low voltage, the potential of N is a high voltage, I1 provides a high voltage, T1 and T5 are turned off, and T6 is turned on, so that the potential of N01 is a low voltage, T7 is turned on, the potential of P1 is a low voltage, T9 is turned on, T12 is turned off, T3 and T4 are both on, the potential of P0 is a high voltage, the potential of P2 is a high voltage, T10 is turned off, T11 is turned on, the potential of S0 is a low voltage, O1 outputs a high voltage; T14 is turned on, T13 is turned off, E1 outputs a high voltage;

In the third phase t3, CK is a low voltage, CB is a high voltage, the potential of P is a low voltage, the potential of N is a high voltage, I1 provides a high voltage, T1 and T5 are turned on, the potential of C01 is a low voltage, T6 is turned on, the potential of N01 is a high voltage, T7 is turned off, the potential of P2 is a high voltage, T2 is turned off, T3 is turned off, the potential of P1 is maintained at a low voltage, T9 is turned on, T11 is turned on, the potential of S0 is a low voltage, T10 is turned off, T12 is turned off, O1 outputs a high voltage; T14 is turned on, T13 is turned off, E1 outputs a high voltage;

In the fourth phase t4, CK is a high voltage, CB is a low voltage, the potential of P is a low voltage, the potential of N is a high voltage, I1 provides a low voltage, T1 and T5 are turned off, the potential of C01 is a low voltage, T6 is turned on, the potential of N01 is a low voltage, T7 is turned on, the potential of P1 is a low voltage, T9 is turned on, T12 is turned off, both T3 and T4 are turned on, the potential of P2 is a high voltage, T10 is turned off, the potential of S0 is a low voltage, O1 outputs a high voltage; T14 is turned on, T13 is turned off, E1 outputs a high voltage;

In the fifth phase t5, CK is a low voltage, CB is a high voltage, the potential of P is a low voltage, the potential of N is a high voltage, I1 provides a low voltage, T1 and T5 are turned on, the potential of C01 is a low voltage, T6 is turned on, the potential of N01 is a high voltage, T7 is turned off, the potential of P2 is pulled down, T8 is turned on, the potential of P1 is a high voltage, T10 is turned on, T11 is turned on, the potential of S0 is a low voltage, T9 is turned off, T12 is turned off, O1 outputs a low voltage; T14 is turned off, T13 is turned on, E1 outputs a low voltage;

In the sixth phase t6, CK is a high voltage, CB is a low voltage, the potential of P is a low voltage, the potential of N is a high voltage, I1 provides a low voltage, T1 and T5 are turned off, the potential of P2 is a low voltage, T2 is turned on, so that the potential of C01 is a high voltage, T4 is turned on, T3 is turned off, T6 is turned off, the potential of N01 is a high voltage, T7 is turned on, the potential of P1 is a high voltage, T10 is turned on, T11 is turned on, the potential of S0 is a low voltage, T9 and T12 are turned off, O1 outputs a low voltage; T14 is turned off, T13 is turned on, and E1 outputs a low voltage;

In the seventh phase t7, CK is a low voltage, CB is a high voltage, the potential of P is a low voltage, the potential of N is a high voltage, I1 provides a low voltage, T1 and T5 are turned on, the potential of P2 is a low voltage, and the potential of C01 is a low voltage, T6 is turned on, the potential of N01 is a high voltage, T7 is turned off, T2 is turned on, and T8 is turned on, so that the potential of P1 is a high voltage, T9 is turned off, T12 is turned off, T10 is turned on, T11 is turned on, and O1 outputs a low voltage; T14 is turned off, T13 is turned on, E1 outputs a low voltage;

In the eighth phase t8, CK is a high voltage, CB is a low voltage, the potential of P is a high voltage, the potential of N is a low voltage, T1 and T5 are turned off, and the potential of CP2 is decreased to enable the potential of P2 to be a low voltage through C3, T2 is turned on, so that the potential of C01 is a high voltage, T6 is turned off, C1 maintains the potential of N01 as a high voltage, T7 is turned on, the potential of P1 is a high voltage, T9 is turned off, T12 is turned on, T11 is turned off, and O1 outputs a high voltage; T14 is turned off, T13 is turned on, E1 outputs a low voltage;

In the ninth phase t9, CK is a low voltage, CB is a high voltage, the potential of P is a high voltage, the potential of N is a low voltage, I1 provides a high voltage, T1 and T5 are turned on, the potential of P2 is a high voltage, and the potential of C01 is a low voltage, T6 is turned on, the potential of N01 is a high voltage, T7 is turned off, T10 is turned off, T11 is turned off, the potential of P1 is maintained at a high voltage, T12 is turned on, T9 is turned off, and O1 outputs a high voltage; T14 is turned off, T13 is turned off, and E1 outputs a low voltage;

In the tenth phase t10, CK is a high voltage, CB is a low voltage, the potential of P is a low voltage, the potential of N is a high voltage, I1 provides a low voltage, both T1 and T5 are turned off, the potential of CP2 drops, and the potential of P2 is controlled by C3 to be a low voltage, T2 is turned on, the potential of C01 is a high voltage, the potential of N01 is a high voltage, T7 is turned on, the potential of P1 is a high voltage, T10 is turned on, T11 is turned on, T9 is turned off, T12 is turned off, and O1 outputs a low voltage; T14 is turned off, T13 is turned on, and E1 outputs a low voltage.

Figure 11:
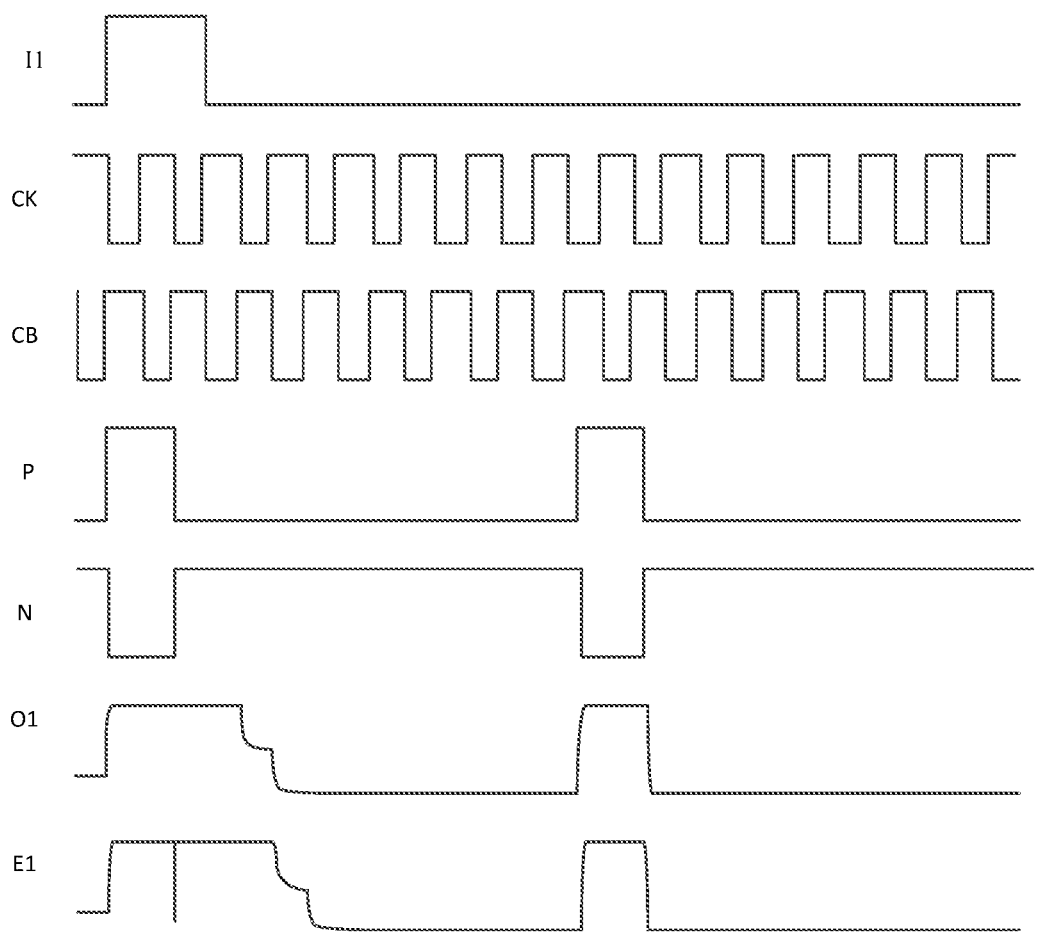
FIG. 11 is another working timing diagram of the signal generating circuit according to of at least one embodiment of the present disclosure as shown in FIG. 9 when the frequency of the first output control signal and the frequency of the second output control signal are less than the frequency of the first clock signal.

When the frequency of the first output control signal and the frequency of the second output control signal are less than the frequency of the first clock signal, the waveform of the signal outputted by O1 may be as shown in FIG. 11.

In FIG. 11, the first clock signal is labeled CK, the second clock signal is labeled CB, the waveform corresponding to P is the waveform of the first output control signal, and the waveform corresponding to N is the wave form of the second output control signal, the waveform corresponding to O1 is the waveform of the signal outputted by O1, and the waveform corresponding to E1 is the waveform of the shift signal outputted by E1.

Figure 12:
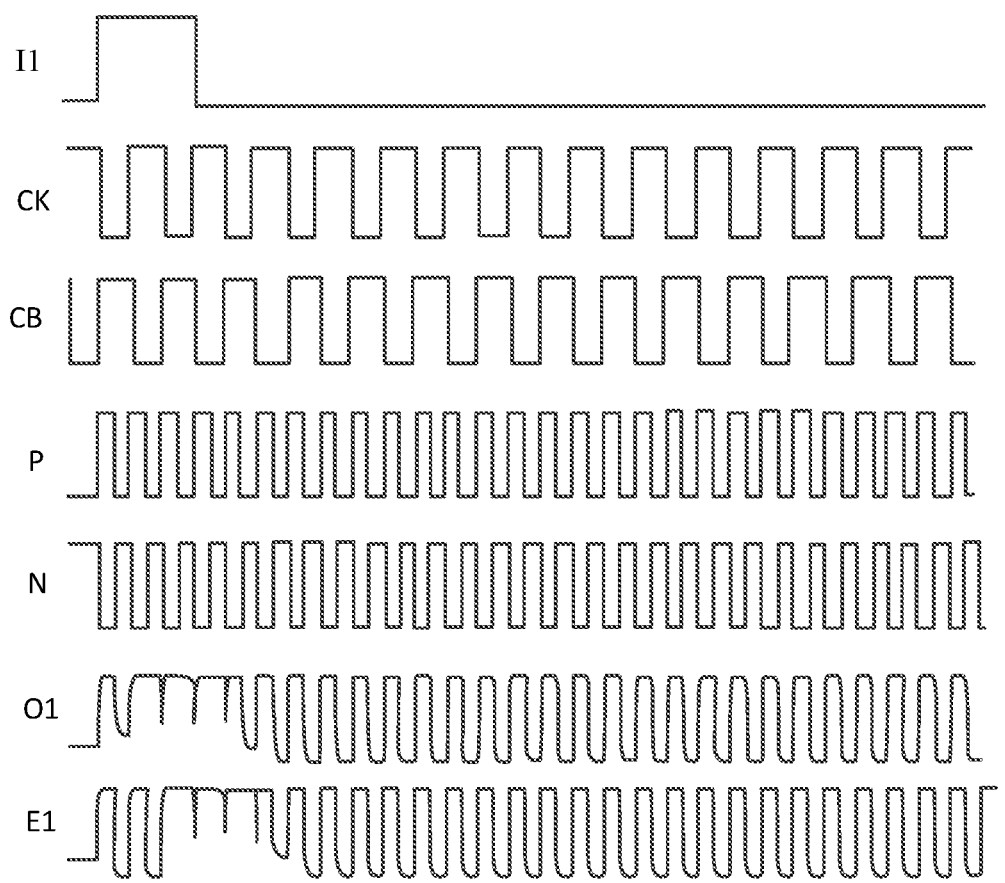
FIG. 12 is another working timing diagram of the signal generating circuit according to of at least one embodiment of the present disclosure as shown in FIG. 9 when the frequency of the first output control signal and the frequency of the second output control signal are less than the frequency of the first clock signal.

When the frequency of the first output control signal and the frequency of the second output control signal are greater than the frequency of the first clock signal, the waveform of the signal outputted by O1 may be as shown in FIG. 12.

In FIG. 12, the first clock signal is labeled CK, the second clock signal is labeled CB, the waveform corresponding to P is the waveform of the first output control signal, and the waveform corresponding to N is the waveform of the second output control signal, the waveform corresponding to O1 is the waveform of the signal outputted by O1, and the waveform corresponding to E1 is the waveform of the shift signal outputted by E1.

In a preferred case, the second node control circuit may include a sixth control transistor, a seventh control transistor, an eighth control transistor, a ninth control transistor, a tenth control transistor, a third storage capacitor and a fourth storage capacitor, wherein, A control electrode of the sixth control transistor is electrically connected to the first clock signal terminal, a first electrode of the sixth control transistor is electrically connected to the input terminal, and a second electrode of the sixth control transistor is electrically connected to the third node, the input terminal is used to provide an input signal;

A control electrode of the seventh control transistor is electrically connected to the second clock signal terminal, and a first electrode of the seventh control transistor is electrically connected to the second node;

A control electrode of the eighth control transistor is electrically connected to the first control node, a first electrode of the eighth control transistor is electrically connected to the second electrode of the seventh control transistor, and a second electrode of the eighth control transistor is electrically connected to the first voltage terminal;

A control electrode of the ninth control transistor and a first electrode of the ninth control transistor are electrically connected to the third node, and a second electrode of the ninth control transistor is electrically connected to the second node;

A control electrode of the tenth control transistor is electrically connected to the second clock signal terminal, a first electrode of the tenth control transistor is electrically connected to the second node, and a second electrode of the tenth control transistor is electrically connected to the second electrode of the seventh control transistor;

A first terminal of the third storage capacitor is electrically connected to the third node, and a second terminal of the third storage capacitor is electrically connected to the second clock signal terminal;

A first terminal of the fourth storage capacitor is electrically connected to the second node, and a second terminal of the fourth storage capacitor is electrically connected to the second voltage terminal.

Optionally, the second node control circuit can adopt a charge pump structure, which can further reduce the potential of the second node in a predetermined period of time, and remain the potential of the second node to be less than VL+Vth10, wherein Vth10 is the threshold voltage of the second output transistor, to reduce the voltage drop when O1 outputs a high-frequency PWM signal (mainly to eliminate the voltage drop caused by Vth10), to ensure that when O1 outputs a low voltage, it is not affected by the change of CB level.

Figure 13:
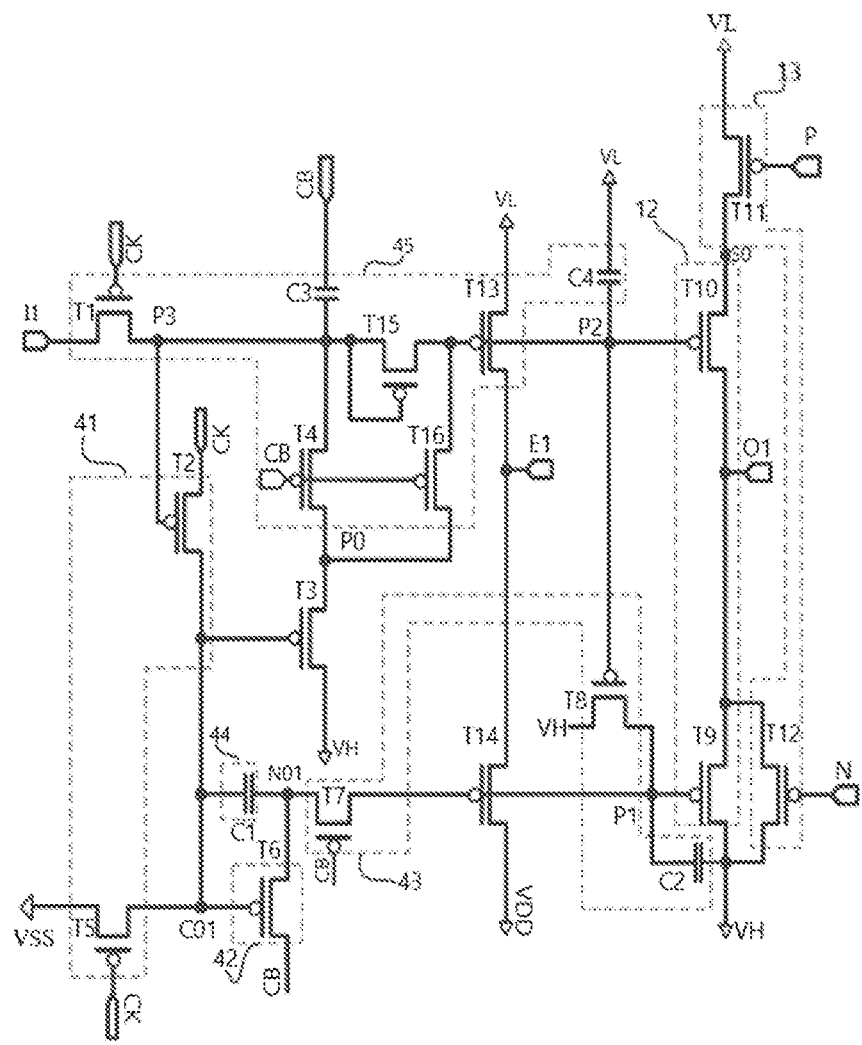
FIG. 13 is a circuit diagram of the signal generation circuit according to at least one embodiment of the present disclosure.

As shown in FIG. 13, the signal generating circuit described in at least one embodiment of the present disclosure includes an input terminal I1, a signal output terminal O1, a transmission control circuit, a first output circuit 12, an output control circuit 13 and a shift signal output circuit 20;

The output control circuit 13 includes a first output control transistor T11 and a second output control transistor T12;

A gate electrode of the first output control transistor T12 is electrically connected to the first output control terminal N, a source electrode of the first output control transistor T12 is electrically connected to the signal output terminal, and a drain electrode of the first output control transistor T12 is electrically connected to the high voltage terminal; the high voltage terminal is used to provide the high voltage VH;

A gate electrode of the second output control transistor T11 is electrically connected to the second output control terminal P, a source electrode of the second output control transistor T11 is electrically connected to the low voltage terminal, and a drain electrode of the second output control transistor T11 is electrically connected to the signal writing-in terminal S0; the low voltage terminal is used to provide the low voltage VL;

The first output circuit 12 includes a first output transistor T9 and a second output transistor T10;

A gate electrode of the first output transistor T9 is electrically connected to the first node P1, a source electrode of the first output transistor T9 is electrically connected to the signal output terminal O1, and a drain electrode of the first output transistor T9 electrically connected to the high voltage terminal;

A gate electrode of the second output transistor T10 is electrically connected to the second node P2, a source electrode of the second output transistor T10 is electrically connected to the signal writing-in terminal S0, and a drain electrode of the second output transistor T10 is electrically connected to the signal output terminal O1;

The transmission control circuit includes a first control node control circuit 4, a first input node control circuit 42, a first node control circuit 43, a first energy storage circuit 44 and a second node control circuit 45;

The first control node control circuit 41 includes a first control transistor T5 and a second control transistor T2;

A gate electrode of the first control transistor T5 is electrically connected to the first clock signal terminal, a source electrode of the first control transistor T5 is electrically connected to the low voltage terminal, and a drain electrode of the first control transistor T5 is electrically connected to the first control node C01; the first clock signal terminal is used to provide the first clock signal CK, and the low voltage terminal is used to provide the low voltage VL;

A gate electrode of the second control transistor T2 is electrically connected to the second node P2, a source electrode of the second control transistor T2 is electrically connected to the first clock signal terminal, and a drain electrode of the second control transistor T2 is electrically connected to the first control node C01;

The first input node control circuit 42 includes a third control transistor T6;

A gate electrode of the third control transistor T6 is electrically connected to the first control node C01, a source electrode of the third control transistor T6 is electrically connected to the first input node N01, and a drain electrode of the third control transistor T6 is electrically connected to the second clock signal terminal; the second clock signal terminal is used for providing the second clock signal CB;

The first energy storage circuit 44 includes a first storage capacitor C1;

A first terminal of the first storage capacitor C1 is electrically connected to the first control node C01, and a second terminal of the first storage capacitor C1 is electrically connected to the first input node N01;

The first node control circuit 43 includes a fourth control transistor T7, a fifth control transistor T8 and a second storage capacitor C2;

A gate electrode of the fourth control transistor T7 is electrically connected to the second clock signal terminal, a source electrode of the fourth control transistor T7 is electrically connected to the first input node N01, and a drain electrode of the fourth control transistor T7 is electrically connected to the first node P1;

A gate electrode of the fifth control transistor T8 is electrically connected to the second node P2, a source electrode of the fifth control transistor T8 is electrically connected to the high voltage terminal, and a drain electrode of the fifth control transistor T8 is electrically connected to the first node P1; the high voltage terminal is used to provide the high voltage VH;

The first terminal of the second storage capacitor C2 is electrically connected to the first node P1, and the second terminal of the second storage capacitor C2 is electrically connected to the high voltage terminal.

The second node control circuit 45 includes a sixth control transistor T1, a seventh control transistor T4, an eighth control transistor T3, a ninth control transistor T15, a tenth control transistor T16, a third storage capacitor C3 and a fourth storage capacitor C4.

A gate electrode of the sixth control transistor T1 is electrically connected to the first clock signal terminal, a source electrode of the sixth control transistor T1 is electrically connected to the input terminal I1, and a drain electrode of the sixth control transistor T1 is electrically connected to the third node P3, and the input terminal I1 is used to provide an input signal; the first clock signal terminal is used to provide a first clock signal CK;

A gate electrode of the seventh control transistor T4 is electrically connected to the second clock signal terminal, and a source electrode of the seventh control transistor T4 is electrically connected to the second node P2; a second clock signal terminal is used to provide the second clock signal CB;

A gate electrode of the eighth control transistor T3 is electrically connected to the first control node C01, a source electrode of the eighth control transistor T3 is electrically connected to the drain electrode of the seventh control transistor T4, and a drain electrode of the eighth control transistor T3 is electrically connected to the high voltage terminal; the high voltage terminal is used to provide the high voltage VH;

A gate electrode of the ninth control transistor T15 and a source electrode of the ninth control transistor T15 are electrically connected to the third node P3, and a drain electrode of the ninth control transistor T15 is electrically connected to the second node P2;

A gate electrode of the tenth control transistor T16 is electrically connected to the second clock signal terminal, a source electrode of the tenth control transistor T16 is electrically connected to the second node P2, and a drain electrode of the tenth control transistor T15 is electrically connected to the drain electrode of the seventh control transistor T4;

The first terminal of the third storage capacitor C3 is electrically connected to the third node P3, and the second terminal of the third storage capacitor C3 is electrically connected to the second clock signal terminal;

The first terminal of the fourth storage capacitor C4 is electrically connected to the second node P2, and the second terminal C4 of the fourth storage capacitor is electrically connected to the low voltage terminal; the low voltage terminal is used to provide the low voltage VL;

The shift signal output circuit 20 includes a first shift output transistor T14 and a second shift output transistor T13;

A gate electrode of the first shift output transistor T14 is electrically connected to the first node P1, a source electrode of the first shift output transistor T14 is electrically connected to the shift signal output terminal 31, a drain electrode of the first shift output transistor T14 is electrically connected to the high voltage terminal; the high voltage terminal is used to provide the high voltage VH;

A gate electrode of the second shift output transistor T13 is electrically connected to the second node P2, a source electrode of the second shift output transistor T13 is electrically connected to the low voltage terminal, and a drain electrode of the second shift output transistor T13 is electrically connected to the shift signal output terminal E1; the low voltage terminal is used to provide the low voltage VL.

In FIG. 13, the first connection node is marked as P0, and P0 is electrically connected to the source electrode of T3.

In the signal generating circuit shown in FIG. 13, all transistors are p-type thin film transistors, but not limited thereto.

Figure 14:
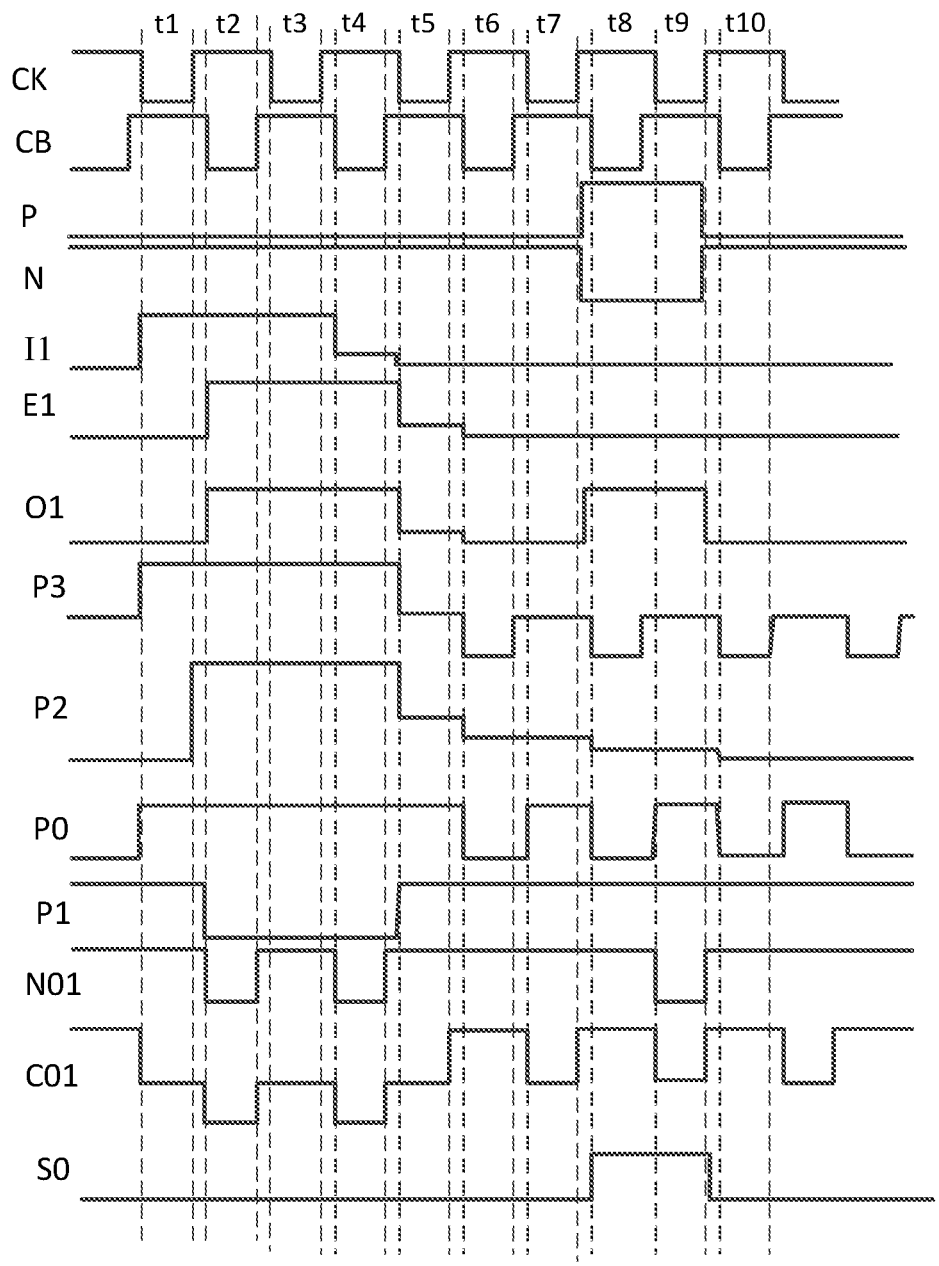
FIG. 14 is a working timing diagram of the signal generating circuit according to at least one embodiment of the present disclosure as shown in FIG. 13.

As shown in FIG. 14, when the signal generating circuit shown in FIG. 13 is in working, In the first phase t1, CK is a low voltage, CB is a high voltage, P is a low voltage, N is a high voltage, I1 provides a high voltage, T1 and T5 are turned on, the potential of P3 is a high voltage, the potential of C01 is a low voltage, T15 is turned off (T15 is diode-connected), and T16 is also turned off, then the potential of P2 is still a low voltage; T6 is turned on, the potential of N01 is a high voltage, T7 is turned off, T8 is turned on, and the potential of P1 remains at a high voltage, T3 is turned on, the potential of P0 is a high voltage, T4 is turned off, T11 is turned on, S0 is a low voltage, T10 is turned on, T9 is turned off, T12 is turned off, O1 continues to output a low voltage; T14 is turned off, T13 is turned on, the potential of the shift signal outputted by E1 is maintained at a low voltage;

In the second phase t2, CK is a high voltage, CB is a low voltage, The potential of P is a low voltage, the potential of N is a high voltage, I1 provides a high voltage, T1 and T5 are turned off, the potential of C01 is a low voltage, T6 is turned on, so that the potential of N01 is a low voltage, and the potential of C01 is pulled down through C1, T7 is turned on, T3 is turned on, T4 is turned on, the potential of P2 is a high voltage, and T8 is turned off, then the potential of P1 is a low voltage, T9 is turned on, and T12 is turned off, both T3 and T4 are turned on, the potential of P0 is a high voltage, the potential of P3 is a high voltage, T16 is turned on, T15 is turned off, the potential of P2 is a high voltage, T10 is turned off, T11 is turned on, the potential of S0 is a low voltage, O1 output is a high voltage; T14 is turned on, T13 is turned off, and E1 outputs a high voltage;

In the third phase t3, CK is a low voltage, CB is a high voltage, the potential of P is a low voltage, the potential of N is a high voltage, I1 provides a high voltage, T1 and T5 are turned on, T2 is turned off, and the potential of C01 is a low voltage, T6 is turned on, the potential of N01 is a high voltage, T7 is turned off, at the same time, the potential of P3 and the potential of CB are high voltage, then T4 and T16 are turned off, then T15 is turned off, the potential of P2 is a high voltage, T8 is turned off, then the potential of P1 remains at a low voltage; T10 is turned off, T11 is turned on, the potential of S0 is a low voltage, at the same time, T9 is turned on, T12 is turned off, then O1 outputs a high voltage; T14 is turned on, T13 is turned off, E1 outputs a high voltage;

In the fourth phase t4, CK is a high voltage, CB is a low voltage, the potential of P is a low voltage, the potential of N is a high voltage, I1 provides a low voltage, T1 and T5 are turned off, the potential of C01 is a low voltage, T6 is turned on, the potential of N01 is a low voltage, T7 is turned on, the potential of P1 is a low voltage, T9 is turned on, T12 is turned off, both T3 and T4 are turned on, the potential of P3 is a high voltage, T16 is turned on, T15 is turned off, and the potential of P2 is a high voltage; T10 is turned off, the potential of S0 is a low voltage, O1 outputs a high voltage; T14 is turned on, T13 is turned off, E1 outputs a high voltage;

In the fifth phase t5, CK is a low voltage, CB is a high voltage, the potential of P is a low voltage, the potential of N is a high voltage, I1 provides a low voltage, T1 and T5 are turned on, the potential of C01 is a low voltage, T6 is turned on, the potential of N01 is a high voltage, T7 is turned off, the potential of P3 is pulled down, T15 is turned on, and the potential of P2 is a low voltage; T4 and T16 are both turned off, T8 is turned on, the potential of P1 is a high voltage, T10 is turned on, T11 is turned on, the potential of S0 is a low voltage, T9 is turned off, T12 is turned off, O1 outputs a low voltage; T14 is turned off, T13 is turned on, and E1 outputs a low voltage;

In the sixth phase t6, CK is a high voltage, CB is a low voltage, the potential of P is a low voltage, the potential of N is a high voltage, I1 provides a low voltage, T1 and T5 are turned off, the potential of P3 is a low voltage, T15 is turned on, T2 is turned on, so that the potential of C01 is a high voltage, T4 is turned on, T3 is turned off, T16 is turned on, and the potential of P2 is maintained at a low voltage; T6 is turned off, the potential of N01 is a high voltage, T7 is turned on, and the potential of P1 is a high voltage, T10 is turned on, T11 is turned on, the potential of S0 is a low voltage, T9 and T12 are turned off, O1 outputs a low voltage; T14 is turned off, T13 is turned on, and E1 outputs a low voltage;

In the seventh phase t7, CK is a low voltage, CB is a high voltage, the potential of P is a low voltage, the potential of N is a high voltage, I1 provides a low voltage, T1 and T5 are turned on, the potential of P3 is pushed up by C3, but the potential of P3 is still a low voltage to control T15 to be turned on, the potential of P2 is a low voltage; the potential of C01 is a low voltage, T3 is turned on, T4 and T16 are turned off, T6 is turned on, the potential of N01 is a high voltage, T7 is turned off, T2 is turned on, T8 is turned on, so that the potential of P1 is a high voltage, T9 is turned off, T12 is turned off, T10 is turned on, T11 is turned on, and O1 outputs a low voltage; T14 is turned off, T13 is turned on, and E1 outputs a low voltage;

In the eighth phase t8, CK is a high voltage, CB is a low voltage, the potential of P is a high voltage, the potential of N is a low voltage, T1 and T5 are turned off, and the potential of CP2 is reduced to further pull down the potential of P3 through C3, T15 is turned on, T2 is turned on, so that the potential of C01 is a high voltage, T3 is turned off, the potential of P2 is remained at a low voltage, T6 is turned off, C1 keeps the potential of N01 as a high voltage, T7 is turned on, T8 is turned on, and the potential of P1 is a high voltage, T9 is turned off, T10 is turned on, T12 is turned on, T11 is turned off, O1 outputs a high voltage; T14 is turned off, T13 is turned on, E1 outputs a low voltage;

In the ninth phase t9, CK is a low voltage, CB is a high voltage, the potential of P is a high voltage, the potential of N is a low voltage, I1 provides a low voltage, T1 and T5 are turned on, and the potential of P3 is a low voltage. Since the potential of P2 is lower than the potential of P3, T15 is turned off, T16 is turned off, and the potential of P2 is maintained at a low voltage; the potential of C01 is maintained at a low voltage, T6 is turned on, the potential of N01 is a high voltage, T7 is turned off, T10 is turned on, T11 is turned off, the potential of P1 is maintained a high voltage, T12 is turned on, T9 is turned off, and O1 outputs a high voltage; T14 is turned off, T13 is turned off, and E1 outputs a low voltage;

In the tenth phase t10, CK is a high voltage, CB is a low voltage, the potential of P is a low voltage, the potential of N is a high voltage, I1 provides a low voltage, both T1 and T5 are turned off, the potential of CP2 drops, and the potential of P3 is controlled by C3 to be a low voltage, T15 is turned on, T4 is turned on, the potential of P0 is a low voltage, T16 is turned on, to control the potential of P2 to be low voltage, T2 is turned on, the potential of C01 is a high voltage, the potential of N01 is a high voltage, T7 is turned on, the potential of P1 is a high voltage, T10 is turned on, T11 is turned on, T9 is turned off, T12 is turned off, O1 outputs a low voltage; T14 is turned off, T13 is turned on, and E1 outputs a low voltage.

According to another specific embodiment, the transmission control circuit may include a fourth node control circuit, a second node control circuit, a first node control circuit and a fifth node control circuit, wherein, The fourth node control circuit is used to write the second voltage into the fourth node under the control of the first clock signal, and write the first clock signal into the fourth node under the control of the potential of the fifth node;

The fifth node control circuit is used to write the input signal into the fifth node under the control of the first clock signal, and to maintain the potential of the fifth node;

The second node control circuit is used to write the input signal into the first node under the control of the first clock signal, and write the first voltage into the first node under the control of the second clock signal and the potential of the first node.

The first node control circuit is used to write the second clock signal into the first node under the control of the potential of the fourth node and the second clock signal, and to write the first voltage into the first node under the control of the potential of the second node.

Figure 15:
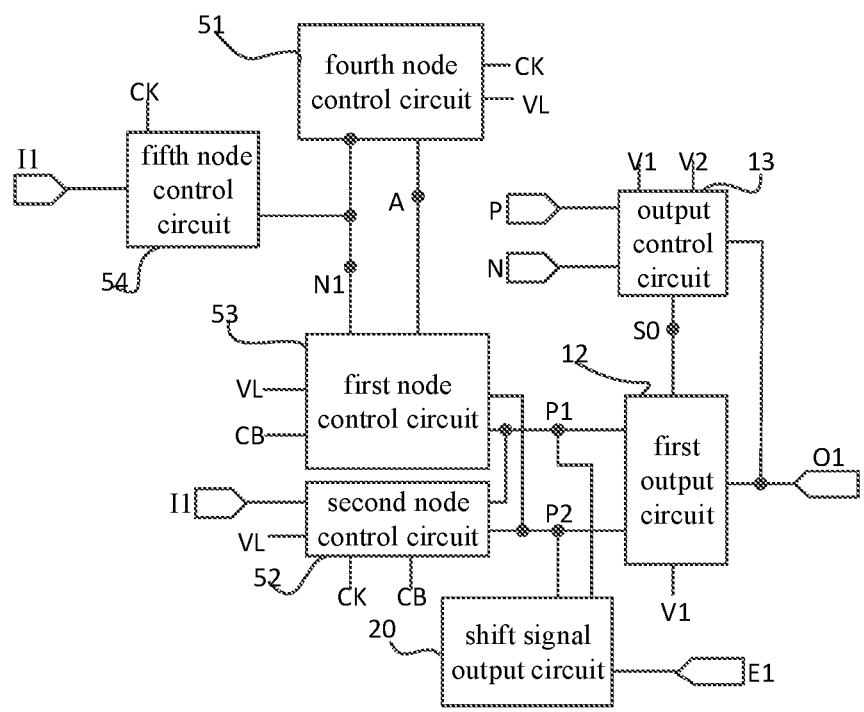
FIG. 15 is a structural diagram of a signal generating circuit according to at least one embodiment of the present invention.

As shown in FIG. 15, based on at least one embodiment of the signal generating circuit shown in FIG. 2, the transmission control circuit may include a fourth node control circuit 51, a second node control circuit 52, and a first node control circuit 53 and the fifth node control circuit 54.

The fourth node control circuit 51 is electrically connected to the first clock signal line, the low voltage terminal, the fourth node A and the fifth node N1 respectively, and is used to write the low voltage VL into the fourth node A under the control of the first clock signal CK, and write the first clock signal CK into the fourth node A under the control of the potential of the fifth node N1; the first clock signal line is used to provide the first clock signal CK, the low voltage terminal is used to provide the low voltage VL;

The fifth node control circuit 54 is respectively electrically connected to the first clock signal line, the input terminal I1 and the fifth node N1, and is used to write the input signal into the fifth node N1 under the control of the first clock signal CK, and maintain the potential of the fifth node N1; the input terminal I1 is used to provide the input signal;

The second node control circuit 52 is respectively electrically connected to the first clock signal line, the input terminal I1, the first node P1, the second clock signal line, the low voltage terminal and the second node P2, and is used to write the input signal into the first node P1 under the control of the first clock signal CK, and write the low voltage VL into the second node P2 under the control of the second clock signal CB and the potential of the first node P1; the second clock signal line is used to provide the second clock signal CB;

The first node control circuit 53 is respectively electrically connected to the fourth node A, the second clock signal line, the first node P1, the second node P2 and the high voltage terminal, and is used to write the second clock signal CB into the first node P1 under the control of the potential of the fourth node A and the second clock signal CB, and write the high voltage VH into the first node P1 under the control of the potential of the second node P2, the high voltage terminal is used to provide the high voltage VH.

When the signal generating circuit shown in FIG. 15 is in operation, the fourth node control circuit 51 controls the potential of the fourth node A, the fifth node control circuit 54 controls the potential of the fifth node N1, the second node control circuit 52 controls the potential of the second node P2, and the first node control circuit 53 controls the potential of the first node P1.

Optionally, the fourth node control circuit includes an eleventh control transistor, a twelfth control transistor and a thirteenth control transistor;

A control electrode of the eleventh control transistor is electrically connected to the first clock signal terminal, a first electrode of the eleventh control transistor is electrically connected to the second voltage terminal, and a second electrode of the eleventh control transistor is electrically connected to the fourth node;

A control electrode of the twelfth control transistor is electrically connected to the fifth node, and a first electrode of the twelfth control transistor is electrically connected to the first clock signal terminal;

A control electrode of the thirteenth control transistor is electrically connected to the fifth node, a first electrode of the thirteenth control transistor is electrically connected to the second electrode of the twelfth control transistor, and a second electrode of the thirteenth control transistor is electrically connected to the fourth node;

The first node control circuit includes a fourteenth control transistor, a fifteenth control transistor, a fifth storage capacitor and a sixteenth control transistor, wherein, A gate electrode of the fourteenth control transistor is electrically connected to the fourth node, and a drain electrode of the fourteenth control transistor is electrically connected to the second clock signal terminal; the second clock signal terminal is used for providing the second clock signal;

A first terminal of the fifth storage capacitor is electrically connected to the second electrode of the fourteenth control transistor, and a second terminal of the fifth storage capacitor is electrically connected to the fourth node;

A control electrode of the fifteenth control transistor is electrically connected to the second clock signal terminal, a first electrode of the fifteenth control transistor is electrically connected to the first node, and a second electrode of the fifteenth control transistor is electrically connected to the second electrode of the fourteenth control transistor;

A control electrode of the sixteenth control transistor is electrically connected to the second node, a first electrode of the sixteenth control transistor is electrically connected to the first node, and a second electrode of the sixteenth control transistor is electrically connected to the first voltage terminal;

The fifth node control circuit includes a seventeenth control transistor and a sixth storage capacitor, wherein, A control electrode of the seventeenth control transistor is electrically connected to the first clock signal terminal, a first electrode of the seventeenth control transistor is electrically connected to the input terminal, and a second electrode of the seventeenth control transistor is electrically connected to the fifth node;

A first terminal of the sixth storage capacitor is electrically connected to the fifth node, and a second terminal of the sixth storage capacitor is electrically connected to the first voltage terminal.

Optionally, the second node control circuit includes an eighteenth control transistor, a nineteenth control transistor, a twentieth control transistor, and a seventh storage capacitor, wherein, A control electrode of the eighteenth control transistor is electrically connected to the first clock signal terminal, a first electrode of the eighteenth control transistor is electrically connected to the input terminal, and a second electrode of the eighteenth control transistor is electrically connected to the second node;

A control electrode of the nineteenth control transistor is electrically connected to the fourth node, and a second electrode of the nineteenth control transistor is electrically connected to the first voltage terminal;

A control electrode of the twentieth control transistor is electrically connected to the second clock signal terminal, a first electrode of the twentieth control transistor is electrically connected to the second node, and a second electrode of the twentieth control transistor is electrically connected to the first electrode of the nineteenth control transistor;

A first terminal of the seventh storage capacitor is electrically connected to the second node, and a second terminal of the seventh storage capacitor is electrically connected to the second clock signal terminal.

Figure 16:
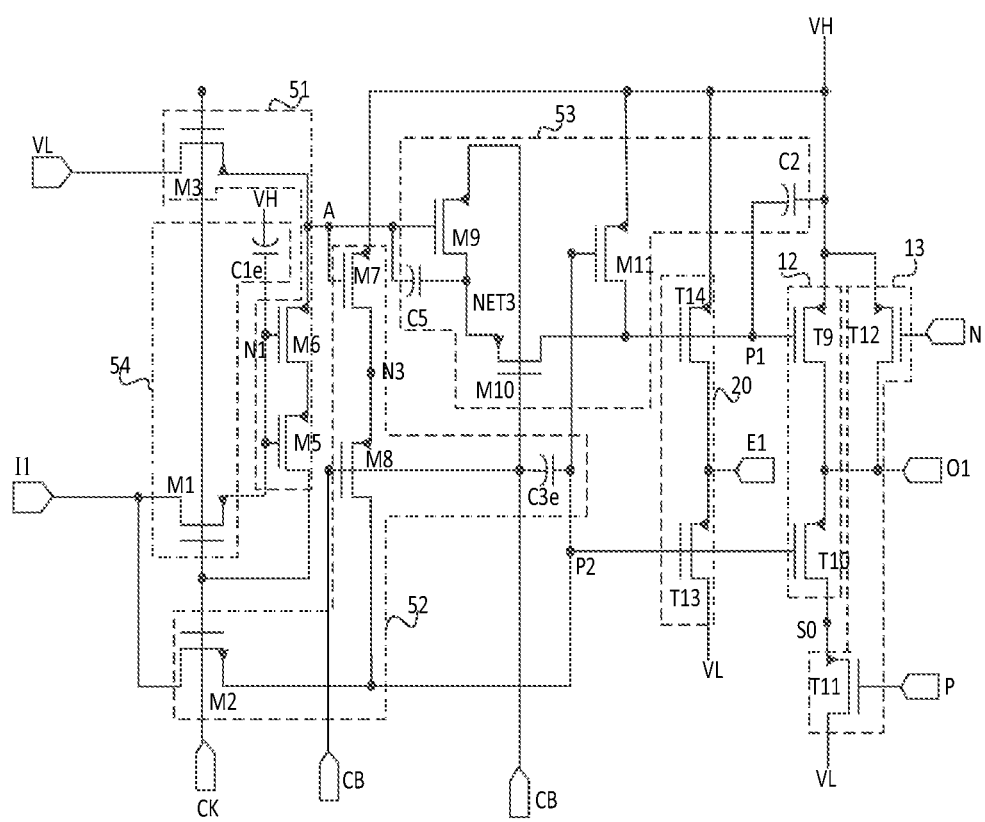
FIG. 16 is a circuit diagram of the signal generation circuit according to at least one embodiment of the present disclosure.

As shown in FIG. 16, on the basis of the signal generation circuit shown in FIG. 15, the output control circuit 13 includes a first output control transistor T11 and a second output control transistor T12;

A gate electrode of the first output control transistor T12 is electrically connected to the first output control terminal N, a source electrode of the first output control transistor T12 is electrically connected to the signal output terminal, and a drain electrode of the first output control transistor T12 is electrically connected to the high voltage terminal; the high voltage terminal is used to provide the high voltage VH;

A gate electrode of the second output control transistor T11 is electrically connected to the second output control terminal P, a source electrode of the second output control transistor T11 is electrically connected to the low voltage terminal, and a drain electrode of the second output control transistor T11 is electrically connected to the signal writing-in terminal S0; the low voltage terminal is used to provide the low voltage VL;

The first output circuit 12 includes a first output transistor T9 and a second output transistor T10;

A gate electrode of the first output transistor T9 is electrically connected to the first node P1, a source electrode of the first output transistor T9 is electrically connected to the signal output terminal O1, and a drain electrode of the first output transistor T9 is electrically connected to the high voltage terminal;

A gate electrode of the second output transistor T10 is electrically connected to the second node P2, a source electrode of the second output transistor T10 is electrically connected to the signal writing-in terminal S0, and a drain electrode of the second output transistor T10 is electrically connected to the signal output terminal O1;

The shift signal output circuit 20 includes a first shift output transistor T14 and a second shift output transistor T13;

A gate electrode of the first shift output transistor T14 is electrically connected to the first node P1, a source electrode of the first shift output transistor T14 is electrically connected to the shift signal output terminal 31, a drain electrode of the first shift output transistor T14 is electrically connected to the high voltage terminal; the high voltage terminal is used to provide the high voltage VH;

A gate electrode of the second shift output transistor T13 is electrically connected to the second node P2, a source electrode of the second shift output transistor T13 is electrically connected to the low voltage terminal, and a drain electrode of the second shift output transistor T13 is electrically connected to the shift signal output terminal E1; the low voltage terminal is used to provide the low voltage VL;

The fourth node control circuit 51 includes an eleventh control transistor M3, a twelfth control transistor M5 and a thirteenth control transistor M6;

A gate electrode of the eleventh control transistor M3 is electrically connected to the first clock signal terminal, a source electrode of the eleventh control transistor M3 is electrically connected to the low voltage terminal, and a drain electrode of the eleventh control transistor M3 is electrically connected to the fourth node A; the low voltage terminal is used for providing the low voltage VL; the first clock signal terminal is used for providing the first clock signal CK;

A gate electrode of the twelfth control transistor M5 is electrically connected to the fifth node N1, and a source electrode of the twelfth control transistor M5 is electrically connected to the first clock signal terminal;

A gate electrode of the thirteenth control transistor M6 is electrically connected to the fifth node N1, a source electrode of the thirteenth control transistor M6 is electrically connected to the drain electrode of the twelfth control transistor M5, and a drain electrode of the thirteenth control transistor M6 is electrically connected to the fourth node A;

The first node control circuit 53 includes a fourteenth control transistor M9, a fifteenth control transistor M10, a fifth storage capacitor C5, a second storage capacitor C2, and a sixteenth control transistor M11, wherein, A gate electrode of the fourteenth control transistor M9 is electrically connected to the fourth node A, a drain electrode of the fourteenth control transistor M9 is electrically connected to the second clock signal terminal; the second clock signal terminal is used to provide the second clock signal CB;

A first terminal of the fifth storage capacitor C5 is electrically connected to a drain electrode of the fourteenth control transistor M9, and a second terminal of the fifth storage capacitor C5 is electrically connected to the fourth node A;

A first terminal of the second storage capacitor C2 is electrically connected to the first node P1, and a second terminal of the second storage capacitor C2 is electrically connected to the high voltage terminal, and the high voltage terminal is used for providing the high voltage VH;

A gate electrode of the fifteenth control transistor M10 is electrically connected to the second clock signal terminal, a source electrode of the fifteenth control transistor M10 is electrically connected to the first node P1, and a drain electrode of the fifteenth control transistor M10 is electrically connected to the drain electrode of the fourteenth control transistor M9;

A gate electrode of the sixteenth control transistor M11 is electrically connected to the second node P2, a source electrode of the sixteenth control transistor M11 is electrically connected to the first node P1, and a drain electrode of the sixteenth control transistor M11 is electrically connected to the high voltage terminal; the high voltage terminal is used to provide the high voltage VH;

The fifth node control circuit 54 includes a seventeenth control transistor M1 and a sixth storage capacitor C1e, wherein, A gate electrode of the seventeenth control transistor M1 is electrically connected to the first clock signal terminal, a source electrode of the seventeenth control transistor M1 is electrically connected to the input terminal I1, and a drain electrode of the seventeenth control transistor M1 is electrically connected to the fifth node N1; the first clock signal terminal is used for providing the first clock signal CK;

A first terminal of the sixth storage capacitor C1e is electrically connected to the fifth node N1, and a second terminal of the sixth storage capacitor C1e is electrically connected to the high voltage terminal; the high voltage terminal is used to provide a high voltage terminal. voltage VH;

The second node control circuit 52 includes an eighteenth control transistor M2, a nineteenth control transistor M7, a twentieth control transistor M8 and a seventh storage capacitor C3e, wherein, A gate electrode of the eighteenth control transistor M2 is electrically connected to the first clock signal terminal, a source electrode of the eighteenth control transistor M2 is electrically connected to the input terminal I1, and a drain electrode of the eighteenth control transistor M2 is electrically connected to the second node P2;

A gate electrode of the nineteenth control transistor M7 is electrically connected to the fourth node A, and a drain electrode of the nineteenth control transistor M7 is electrically connected to the high voltage terminal; the high voltage terminal is used to provide the high voltage VH;

A gate electrode of the twentieth control transistor M8 is electrically connected to the second clock signal terminal, a source electrode of the twentieth control transistor M8 is electrically connected to the second node P2, and a drain electrode of the twentieth control transistor M8 is electrically connected to the source electrode of the nineteenth control transistor M7;

A first terminal of the seventh storage capacitor C3e is electrically connected to the second node P2, and a second terminal of the seventh storage capacitor C3e is electrically connected to the second clock signal terminal; the second clock signal terminal is used for providing the second clock signal CB.

In FIG. 16, the second connection node is marked as N3, and N3 is electrically connected to the source electrode of M7; the third connection node is marked as NET3, and NET3 is electrically connected to the drain electrode of M9.

In FIG. 16, all transistors are PMOS transistors (P-type metal-oxide-semiconductor transistors), but not limited thereto.

Figure 17:
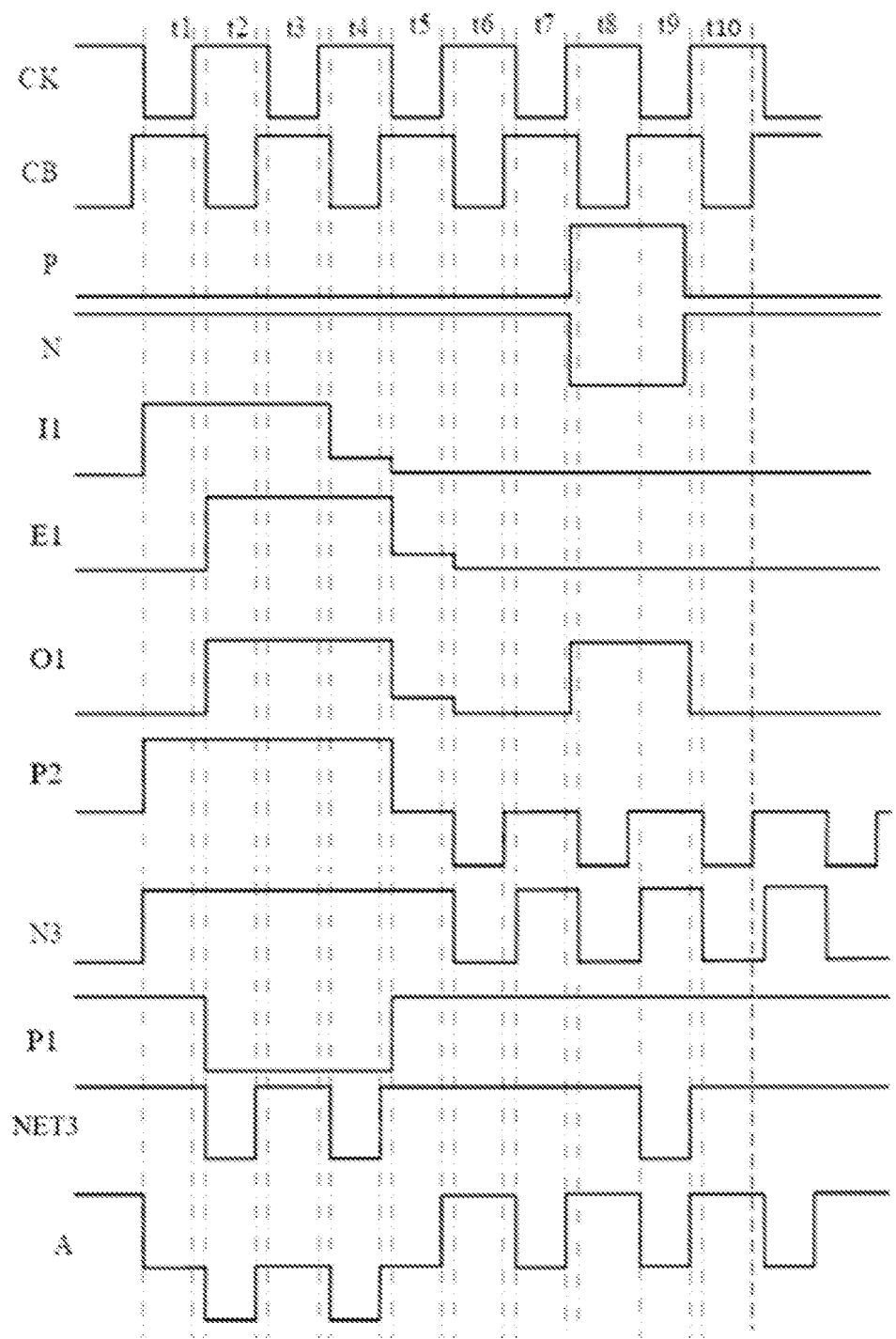
FIG. 17 is a working timing diagram of the signal generating circuit according to at least one embodiment of the present disclosure as shown in FIG. 16.

As shown in FIG. 17, when the signal generating circuit shown in FIG. 16 is working, In the first phase t1, CK is a low voltage, CB is a high voltage, the potential of P is a low voltage, the potential of N is a high voltage, I1 provides a high voltage, M2, M1 and M3 are all turned on, the potential of N1 is a high voltage, M5 and M6 are turned off, the potential of A is a low voltage, M7 is turned on, M8 is turned off, M9 is turned on, M10 is turned off, the potential of P2 is a high voltage, the potential of P1 is maintained at a high voltage, T9 is turned off, T12 is turned off, T10 is turned off, and T11 is turned on, O1 continues to output a low voltage, both T14 and T13 are turned off, and E1 continues to output a low voltage;

In the second phase t2, CK is a high voltage, CB is a low voltage, the potential of P is a low voltage, the potential of N is a high voltage, I1 provides a high voltage, M2, M1 and M3 are all turned off, M7 is turned on, and the potential of N1 is maintained at a high voltage, M5 and M6 are turned off, the potential of A is a low voltage, the potential of P2 is maintained at a high voltage, M7 and M8 are both turned on, M9 and M10 are both turned on, the potential of P1 is a low voltage, T9 is turned on, T12 is turned off, T10 is turned off, T11 is turned on, O1 outputs a high voltage, T14 is turned on, T13 is turned off, E1 outputs a high voltage;

In the third phase t3, CK is a low voltage, CB is a high voltage, the potential of P is a low voltage, the potential of N is a high voltage, I1 provides a high voltage, M2, M1 and M3 are all turned on, and the potential of P2 is a high voltage, the potential of N1 is a high voltage, the potential of A is a low voltage, M5 and M6 are both turned off, M7 is turned on, M8 is turned off, M9 is turned on, M10 is turned off, the potential of P1 is maintained at low voltage, T9 is turned on, T12 is turned off, T10 is turned off, T11 is turned on, O1 outputs a high voltage, T14 is turned on, T13 is turned off, E1 outputs a high voltage;

In the fourth phase t4, CK is a high voltage, CB is a low voltage, the potential of P is a low voltage, the potential of N is a high voltage, I1 provides a low voltage, M2, M1 and M3 are all turned off, and the potential of N1 is maintained at a high voltage, M5 and M6 are both turned off, the potential of A is a low voltage, M9 is turned on, M10 is turned on, the potential of P1 is a low voltage, M7 and M8 are both turned on, the potential of P2 is a high voltage, T9 is turned on, T12 is turned off, T10 is turned off, T11 is turned on, O1 outputs a high voltage; T14 is turned on, T13 is turned off, E1 outputs a high voltage;

In the fifth phase t5, CK is a low voltage, CB is a high voltage, the potential of P is a low voltage, the potential of N is a high voltage, I1 provides a low voltage, M2, M1 and M3 are all turned on, the potential of A is a low voltage, the potential of P2 is a low voltage, the potential of N1 is a low voltage, M5 and M6 are turned on, M7 is turned on, M8 is turned off, M11 is turned on, the potential of P1 is a high voltage, T9 is turned off, T12 is turned off, T10 is turned on, T11 is turned on, O1 outputs a low voltage; T14 is turned off, T13 is turned on, and E1 outputs a low voltage;

In the sixth phase t6, CK is a high voltage, CB is a low voltage, the potential of P is a low voltage, the potential of N is a high voltage, I1 provides a low voltage, M2, M1 and M3 are all turned off, and the potential of N1 is maintained at a low voltage, M5 and M6 are turned on, the potential of A is a high voltage, M9 is turned off, the potential of NET3 is a high voltage, M10 is turned on, the potential of P1 is a high voltage, the potential of P2 is pulled down by C3e, T9 is turned off, T12 is turned off, T10 is turned on, T11 is turned on, O1 outputs a low voltage; T14 is turned off, T13 is turned on, and E1 outputs a low voltage;

In the seventh phase t7, CK is a low voltage, CB is a high voltage, the potential of P is a low voltage, the potential of N is a high voltage, I1 provides a low voltage, M2, M1 and M3 are all turned on, the potential of A is a low voltage, the potential of P2 is a low voltage, the potential of N1 is a low voltage, M11 is turned on, the potential of P1 is a high voltage, T9 is turned off, T12 is turned off, T10 is turned on, T11 is turned on, O1 output a low voltage; T14 is turned off, T13 is turned on, E1 output is a low voltage;

In the eighth phase t8, CK is a high voltage, CB is a low voltage, the potential of P is a high voltage, the potential of N is a low voltage, I1 provides a low voltage, M2, M1 and M3 are all turned off, and the potential of N1 is a low voltage, M5 and M6 are turned on, the potential of A is a high voltage, the potential of P2 is pulled low, M11 is turned on, the potential of P1 is a high voltage, T9 is turned off, T12 is turned on, T10 is turned on, T11 is turned off, and O1 outputs a high voltage; T14 is turned off, T13 is turned on, E1 outputs a low voltage;

In the ninth phase t9, CK is a low voltage, CB is a high voltage, the potential of P is a high voltage, the potential of N is a low voltage, I1 provides a low voltage, M2, M1 and M3 are all turned on, and the potential of A is a low voltage, the potential of P2 is maintained at a low level, T10 is turned on, T11 is turned off, T12 is turned on, the potential of P1 is maintained at a high voltage, T9 is turned off, and O1 outputs a high voltage; T14 is turned off, T13 is turned off, and E1 continues to output a low voltage;

In the tenth phase t10, CK is a high voltage, CB is a low voltage, the potential of P is a low voltage, the potential of N is a high voltage, I1 provides a low voltage, M2, M1 and M3 are all turned off, the potential of P2 is pulled down by C3e, M11 is turned on, the potential of P1 is a high voltage, T9 is turned off, T12 is turned off, T10 is turned on, T11 is turned on, O1 outputs a low voltage, T14 is turned off, T13 is turned on, and E1 outputs a low voltage.

In a preferred case, the second node control circuit includes an eighteenth control transistor, a nineteenth control transistor, a twentieth control transistor, a seventh storage capacitor, a twenty-first control transistor, a twenty-second control transistor and an eighth storage capacitor.

A control electrode of the eighteenth control transistor is electrically connected to the first clock signal terminal, a first electrode of the eighteenth control transistor is electrically connected to the input terminal, and a second electrode of the eighteenth control transistor is electrically connected to the sixth node;

A control electrode of the twenty-second control transistor and a first electrode of the twenty-second control transistor are both electrically connected to the sixth node, and a second electrode of the twenty-second control transistor is electrically connected to the second node;

A first terminal of the eighth storage capacitor is electrically connected to the sixth node, and a second terminal of the eighth storage capacitor is electrically connected to the second clock signal terminal;

A control electrode of the nineteenth control transistor is electrically connected to the fourth node, and a second electrode of the nineteenth control transistor is electrically connected to the first voltage terminal;

A control electrode of the twentieth control transistor is electrically connected to the second clock signal terminal, a first electrode of the twentieth control transistor is electrically connected to the sixth node, and a second electrode of the twentieth control transistor is electrically connected to the first electrode of the nineteenth control transistor;

A control electrode of the twenty-first control transistor is electrically connected to the second clock signal terminal, a first electrode of the twenty-first control transistor is electrically connected to the second node, and a second electrode the twenty-first control transistor is electrically connected to the second electrode of the twentieth control transistor;

A control electrode of the twenty-second control transistor and a first electrode of the twenty-second control transistor are both electrically connected to the sixth node, and a second electrode of the twenty-second control transistor is electrically connected to the second node;

A first terminal of the seventh storage capacitor is electrically connected to the second node, and a second terminal of the seventh storage capacitor is electrically connected to the second voltage terminal.

Optionally, the second node control circuit can adopt a charge pump structure, which can further pull down the potential of the second node in a predetermined time period, and keep the potential of the second node to be less than VL+Vth10, where Vth10 is the threshold voltage of the second output transistor, to reduce the voltage drop when O1 outputs a high-frequency PWM signal, so as to ensure that when O1 outputs a low voltage, it is not affected by the change of CB level.

Figure 18:
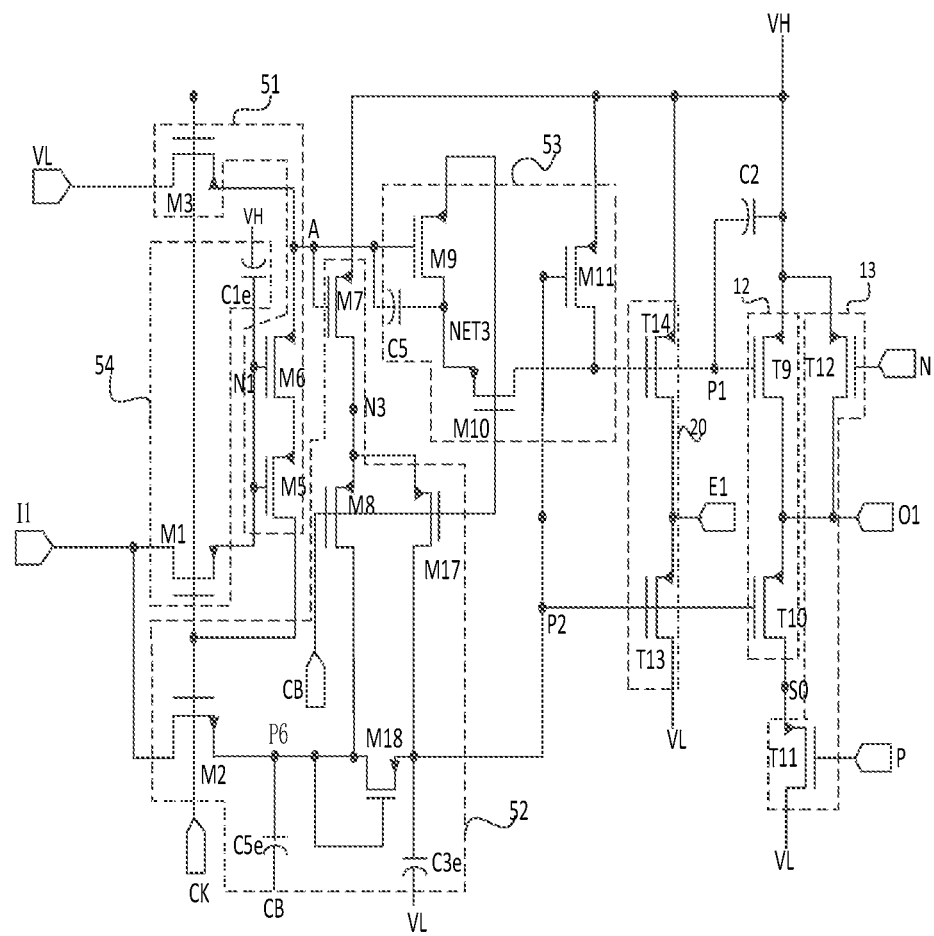
FIG. 18 is a circuit diagram of the signal generation circuit according to at least one embodiment of the present disclosure.

As shown in FIG. 18, on the basis of the signal generation circuit shown in FIG. 15, the output control circuit 13 includes a first output control transistor T11 and a second output control transistor T12;

A gate electrode of the first output control transistor T12 is electrically connected to the first output control terminal N, a source electrode of the first output control transistor T12 is electrically connected to the signal output terminal, and a drain electrode of the first output control transistor T12 is electrically connected to the high voltage terminal; the high voltage terminal is used to provide the high voltage VH;

A gate electrode of the second output control transistor T11 is electrically connected to the second output control terminal P, a source electrode of the second output control transistor T11 is electrically connected to the low voltage terminal, and a drain electrode of the second output control transistor T11 is electrically connected to the signal writing-in terminal S0; the low voltage terminal is used to provide the low voltage VL;

The first output circuit 12 includes a first output transistor T9 and a second output transistor T10;

A gate electrode of the first output transistor T9 is electrically connected to the first node P1, a source electrode of the first output transistor T9 is electrically connected to the signal output terminal O1, and a drain electrode of the first output transistor T9 is electrically connected to the high voltage terminal;

A gate electrode of the second output transistor T10 is electrically connected to the second node P2, a source electrode of the second output transistor T10 is electrically connected to the signal writing-in terminal S0, and a drain electrode of the second output transistor T10 is electrically connected to the signal output terminal O1;

The shift signal output circuit 20 includes a first shift output transistor T14 and a second shift output transistor T13;

A gate electrode of the first shift output transistor T14 is electrically connected to the first node P1, a source electrode of the first shift output transistor T14 is electrically connected to the shift signal output terminal 31, a drain electrode of the first shift output transistor T14 is electrically connected to the high voltage terminal; the high voltage terminal is used to provide the high voltage VH;

A gate electrode of the second shift output transistor T13 is electrically connected to the second node P2, a source electrode of the second shift output transistor T13 is electrically connected to the low voltage terminal, and a drain electrode of the second shift output transistor T13 is electrically connected to the shift signal output terminal E1; the low voltage terminal is used to provide the low voltage VL;

The fourth node control circuit 51 includes an eleventh control transistor M3, a twelfth control transistor M5 and a thirteenth control transistor M6;

A gate electrode of the eleventh control transistor M3 is electrically connected to the first clock signal terminal, a source electrode of the eleventh control transistor M3 is electrically connected to the low voltage terminal, and a drain electrode of the eleventh control transistor M3 is electrically connected to the fourth node A; the low voltage terminal is used for providing the low voltage VL; the first clock signal terminal is used for providing the first clock signal CK;

A gate electrode of the twelfth control transistor M5 is electrically connected to the fifth node N1, and a source electrode of the twelfth control transistor M5 is electrically connected to the first clock signal terminal;

A gate electrode of the thirteenth control transistor M6 is electrically connected to the fifth node N1, a source electrode of the thirteenth control transistor M6 is electrically connected to the drain electrode of the twelfth control transistor M5, and a drain electrode of the thirteenth control transistor M6 is electrically connected to the fourth node A;

The first node control circuit 53 includes a fourteenth control transistor M9, a fifteenth control transistor M10, a fifth storage capacitor C5 and a sixteenth control transistor M11, wherein, A gate electrode of the fourteenth control transistor M9 is electrically connected to the fourth node A, and a drain electrode of the fourteenth control transistor M9 is electrically connected to the second clock signal terminal; the second clock signal terminal is used to provide the second clock signal CB;

A first terminal of the fifth storage capacitor C5 is electrically connected to the drain electrode of the fourteenth control transistor M9, and a second terminal of the fifth storage capacitor C5 is electrically connected to the fourth node A;

A gate electrode of the fifteenth control transistor M10 is electrically connected to the second clock signal terminal, a source electrode of the fifteenth control transistor M10 is electrically connected to the first node P1, and a drain electrode of the fifteenth control transistor M10 is electrically connected to the drain electrode of the fourteenth control transistor M9;

A gate electrode of the sixteenth control transistor M11 is electrically connected to the second node P2, a source electrode of the sixteenth control transistor M11 is electrically connected to the first node P1, and a drain electrode of the sixteenth control transistor M11 is electrically connected to the high voltage terminal, the high voltage terminal is used to provide the high voltage VH;

The fifth node control circuit 54 includes a seventeenth control transistor M1 and a sixth storage capacitor C1e, wherein, A gate electrode of the seventeenth control transistor M1 is electrically connected to the first clock signal terminal, a source electrode of the seventeenth control transistor M1 is electrically connected to the input terminal I1, and a drain electrode of the seventeenth control transistor M1 is electrically connected to the fifth node N; the first clock signal terminal is used for providing the first clock signal CK;

A first terminal of the sixth storage capacitor C1e is electrically connected to the fifth node N1, and a second terminal of the sixth storage capacitor C1e is electrically connected to the high voltage terminal; the high voltage terminal is used to provide a high voltage VH;

The second node control circuit 52 includes an eighteenth control transistor M2, a nineteenth control transistor M7, a twentieth control transistor M8, a seventh storage capacitor C3e, a twenty-first control transistor M17, a twenty-second control transistor M18 and the eighth storage capacitor C5e, wherein, A gate electrode of the eighteenth control transistor M2 is electrically connected to the first clock signal terminal, a source electrode of the eighteenth control transistor M2 is electrically connected to the input terminal I1, and a drain electrode of the eighteenth control transistor M2 is electrically connected to the sixth node P6;

A gate electrode of the twenty-second control transistor M18 and a source electrode of the twenty-second control transistor M18 are both electrically connected to the sixth node P6, and a drain electrode of the twenty-second control transistor M18 is electrically connected to the second node P2;

A first terminal of the eighth storage capacitor C5e is electrically connected to the sixth node P6, and a second terminal of the eighth storage capacitor C5e is electrically connected to the second clock signal terminal; the second clock signal terminal is used for providing a second clock signal CB;

A gate electrode of the nineteenth control transistor M7 is electrically connected to the fourth node A, and a drain electrode of the nineteenth control transistor M7 is electrically connected to the high voltage terminal; the high voltage terminal is used to provide the high voltage VH;

A gate electrode of the twentieth control transistor M8 is electrically connected to the second clock signal terminal, a source electrode of the twentieth control transistor M8 is electrically connected to the sixth node P6, and a drain electrode of the twentieth control transistor M8 is electrically connected to the source electrode of the nineteenth control transistor M7;

A gate electrode of the twenty-first control transistor M17 is electrically connected to the second clock signal terminal, a source electrode of the twenty-first control transistor M17 is electrically connected to the second node P2, and a drain electrode of the twenty-first control transistor M17 is electrically connected to the drain electrode of the twentieth control transistor M8;

A gate electrode of the twenty-second control transistor M18 and a source electrode of the twenty-second control transistor M18 are both electrically connected to the sixth node P6, and a drain electrode of the twenty-second control transistor M18 is electrically connected to the second node P2;

A first terminal of the seventh storage capacitor C3e is electrically connected to the second node P2, and a second terminal of the seventh storage capacitor is electrically connected to the low voltage terminal; the low voltage terminal is used for providing the low voltage VL.

In at least one embodiment of the signal generating circuit shown in FIG. 18, all transistors are PMOS transistors, but not limited thereto.

In FIG. 18, the second connection node marked as N3 is electrically connected to the source electrode of M7; the third connection node marked as NET3 is electrically connected to the drain electrode of M9.

Figure 19:
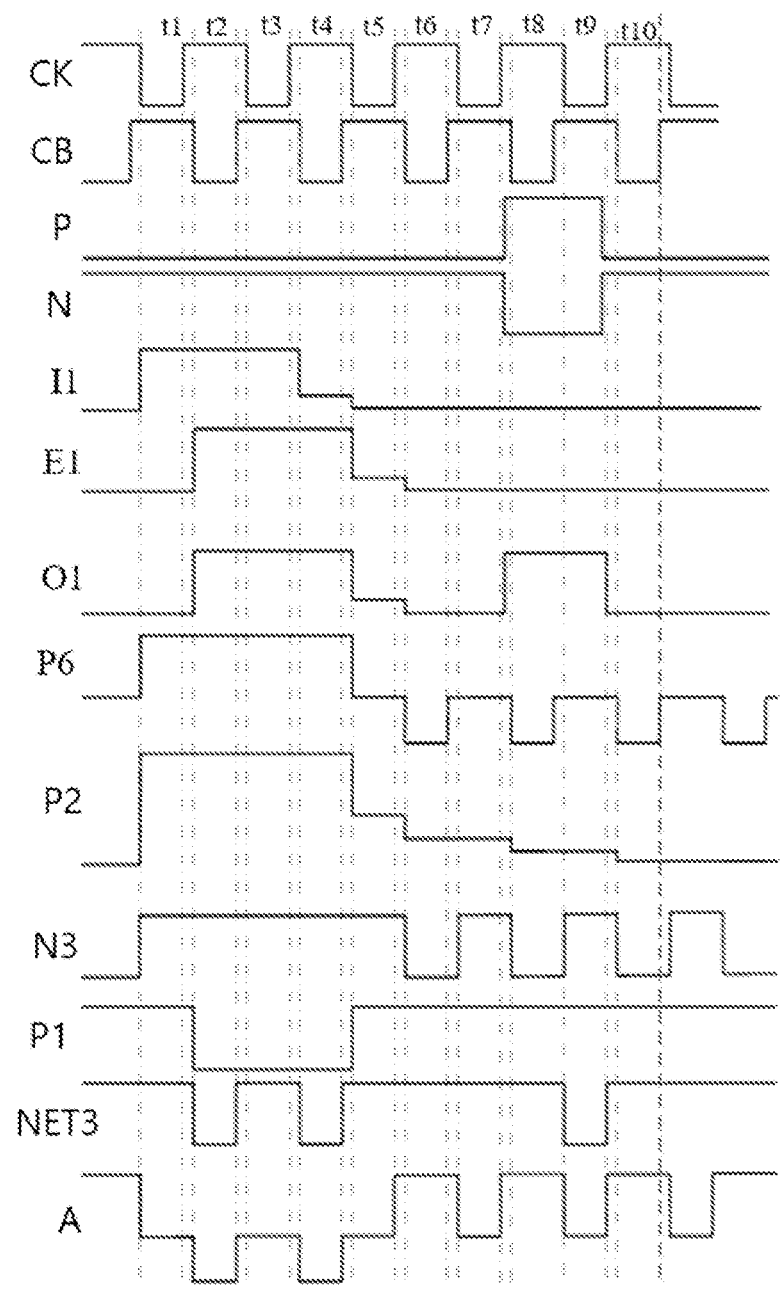
FIG. 19 is a working timing diagram of the signal generating circuit according to at least one embodiment of the present disclosure as shown in FIG. 18.

FIG. 19 is a working timing diagram of the signal generating circuit shown in FIG. 18.

As shown in FIG. 19, when the signal generating circuit shown in FIG. 18 is working, In the first phase t1, CK is a low voltage, CB is a high voltage, the potential of P is a low voltage, the potential of N is a high voltage, I1 provides a high voltage, M2, M1 and M3 are all turned on, the potential of N1 is a high voltage, M5 and M6 are turned off, the potential of A is a low voltage, M7 is turned on, M8 is turned off, M9 is turned on, M10 is turned off, the potential of P2 is a high voltage, the potential of P6 is a high voltage, M18 is turned off, the potential of P1 is maintained at a high voltage, T9 is turned off, T12 is turned off, T10 is turned off, T11 is turned on, O1 continues to output a low voltage, T14 and T13 are both turned off, E1 continues to output a low voltage;

In the second phase t2, CK is a high voltage, CB is a low voltage, the potential of P is a low voltage, the potential of N is a high voltage, I1 provides a high voltage, M2, M1 and M3 are all turned off, M7 is turned on, and the potential of N3 is a high voltage, the potential of N1 is maintained at a high voltage, M5 and M6 are turned off, the potential of A is a low voltage, M7 and M8 are both turned on, M9 and M10 are both turned on, the potential of P6 is a high voltage, M18 is turned off, M17 is turned on, and the potential of P2 is a high voltage, the potential of P1 is a low voltage, T9 is turned on, T12 is turned off, T10 is turned off, T11 is turned on, O1 outputs a high voltage, T14 is turned on, T13 is turned off, and E1 outputs a high voltage;

In the third phase t3, CK is a low voltage, CB is a high voltage, the potential of P is a low voltage, the potential of N is a high voltage, I1 provides a high voltage, M2, M1 and M3 are all turned on, and the potential of P6 is a high voltage, M18 is turned off, the potential of N1 is a high voltage, the potential of A is a low voltage, M5 and M6 are turned off, M7 is turned on, M8 is turned off, M9 is turned on, M10 is turned off, M17 is turned off, the potential of P2 is maintained at a high voltage, and the potential of P1 is maintained at a low voltage, T9 is turned on, T12 is turned off, T10 is turned off, T11 is turned on, O1 outputs a high voltage, T14 is turned on, T13 is turned off, and E1 outputs a high voltage;

In the fourth phase t4, CK is a high voltage, CB is a low voltage, the potential of P is a low voltage, the potential of N is a high voltage, I1 provides a low voltage, M2, M1 and M3 are all turned off, and the potential of N1 is maintained at a high voltage, M5 and M6 are both turned off, the potential of A is a low voltage, M9 is turned on, M10 is turned on, the potential of P1 is a low voltage, M7 and M8 are both turned on, the potential of P6 is a high voltage, M18 is turned off, M17 is turned on, and the potential of P2 is a high voltage, T9 is turned on, T12 is turned off, T10 is turned off, T11 is turned on, O1 outputs a high voltage; T14 is turned on, T13 is turned off, E1 outputs a high voltage;

In the fifth phase t5, CK is a low voltage, CB is a high voltage, the potential of P is a low voltage, the potential of N is a high voltage, I1 provides a low voltage, M2, M1 and M3 are all turned on, the potential of A is a low voltage, the potential of P6 is a low voltage, M18 is turned on, the potential of P2 is a low voltage, the potential of N1 is a low voltage, M5 and M6 are turned on, M7 is turned on, M8 is turned off, M11 is turned on, the potential of P1 is a high voltage, T9 is turned off, T12 is turned off, T10 is turned on, T11 is turned on, O1 outputs a low voltage; T14 is turned off, T13 is turned on, and E1 outputs a low voltage;

In the sixth phase t6, CK is a high voltage, CB is a low voltage, the potential of P is a low voltage, the potential of N is a high voltage, I1 provides a low voltage, M2, M1 and M3 are all turned off, and the potential of N1 is maintained at a low voltage, the potential of P6 is a low voltage, M18 is turned on, and the potential of P2 is a low voltage; M5 and M6 are turned on, the potential of A is a high voltage, M9 is turned off, the potential of NET3 is a high voltage, M10 is turned on, and the potential of P1 is a high voltage, the potential of P2 is pulled down by C3e, T9 is turned off, T12 is turned off, T10 is turned on, T11 is turned on, O1 outputs a low voltage; T14 is turned off, T13 is turned on, and E1 outputs a low voltage;

In the seventh phase t7, CK is a low voltage, CB is a high voltage, the potential of P is a low voltage, the potential of N is a high voltage, I1 provides a low voltage, M2, M1 and M3 are all turned on, the potential of A is a low voltage, the potential of P6 is a low voltage, M18 is turned on, the potential of P2 is a low voltage; the potential of N1 is a low voltage, M11 is turned on, the potential of P1 is a high voltage, T9 is turned off, T12 is turned off, T10 is turned on, T11 is turned on, O1 outputs a low voltage; T14 is turned off, T13 is turned on, E1 outputs a low voltage;

In the eighth phase t8, CK is a high voltage, CB is a low voltage, the potential of P is a high voltage, the potential of N is a low voltage, I1 provides a low voltage, M2, M1 and M3 are all turned off, and the potential of N1 is a low voltage, M5 and M6 are turned on, the potential of A is a high voltage, the potential of P6 is pulled down, M18 is turned on, the potential of P2 is a low voltage; M11 is turned on, the potential of P1 is a high voltage, T9 is turned off, T12 is turned on, T10 is turned on, and T11 is turned off, O1 outputs a high voltage; T14 is turned off, T13 is turned on, E1 outputs a low voltage;

In the ninth phase t9, CK is a low voltage, CB is a high voltage, the potential of P is a high voltage, the potential of N is a low voltage, I1 provides a low voltage, M2, M1 and M3 are all turned on, and the potential of A is a low voltage, the potential of P6 is maintained at a low voltage, M18 is turned on, the potential of P2 is a low voltage, T10 is turned on, T11 is turned off, T12 is turned on, the potential of P1 is kept at high voltage, T9 is turned off, and O1 outputs a high voltage; T14 is turned off, T13 is turned off, E1 Continue to output low voltage;

In the tenth phase t10, CK is a high voltage, CB is a low voltage, the potential of P is a low voltage, the potential of N is a high voltage, I1 provides a low voltage, M2, M1 and M3 are all turned off, the potential of P6 is pulled down by C3e, M18 is turned on, the potential of P2 is a low voltage, M11 is turned on, the potential of P1 is a high voltage, T9 is turned off, T12 is turned off, T10 is turned on, T11 is turned on, O1 outputs a low voltage, T14 is turned off, T13 is turned on, and E1 outputs a low voltage.

The signal generation method described in the embodiment of the present disclosure is applied to the above-mentioned signal generation circuit, and the signal generation method includes:

Controlling, by a transmission control circuit, a potential of a first node and a potential of a second node under the control of a first clock signal, a second clock signal and an input signal;

Controlling, by a first output circuit, the signal output terminal to be connected to the first voltage terminal under the control of a potential of a first node, and the signal output terminal to be connected to a signal writing-in terminal under the control of a potential of a second node;

Controlling, by the output control circuit, the signal writing-in terminal to be connected to the second voltage terminal under the control of the second output control signal, and the signal output terminal to be connected to the first voltage terminal under the control of the first output control signal.

In the signal generation method described in the embodiment of the present disclosure, by using the output control circuit, under the control of the second output control signal and the first output control signal, the signal output terminal is controlled to output the Pulse Width Modulation (PWM) signal, the frequency and duty cycle of the PWM signal can be freely adjusted. At high frequencies, the frequency of the PWM signal can be higher than the pixel charging line frequency. At low frequencies, the PWM frequency can be the same as the frame frequency. The adjustment range is greatly expanded.

The signal generation module described in the embodiment of the present disclosure includes a plurality of stages of the signal generation circuit.

According to a specific implementation, in addition to a first stage of signal generation circuit, an input terminal included in each stage of the signal generation circuit is electrically connected to a signal output terminal of an adjacent previous stage of shift register unit.

According to another specific embodiment, the signal generating circuit further includes a shift signal output terminal;

In addition to the first stage of signal generating circuit, the input terminal included in each stage of signal generating circuit is electrically connected to the shift signal output terminal of the adjacent previous stage of shift register unit.

The display device according to the embodiment of the present disclosure includes the above-mentioned signal generating module.

The display device provided by the embodiment of the present disclosure may be any product or component with a display function, such as a mobile phone, a tablet computer, a television, a monitor, a notebook computer, a digital photo frame, and a navigator.

The above are the optional embodiments of the present disclosure. It should be pointed out that for those skilled in the art, several improvements and modifications can be made without departing from the principles described in the present disclosure, and these improvements and modifications should be regarded as the protection scope of the present disclosure.

The above embodiments are for illustrative purposes only, but the present disclosure is not limited thereto. Obviously, those skilled in the art may make further modifications and improvements without departing from the spirit of the present disclosure, and these modifications and improvements shall also fall within the scope of the present disclosure.

What is claimed is:

1. A signal generation circuit, comprising an input terminal, a signal output terminal, a transmission control circuit, a first output circuit, and an output control circuit; wherein
the transmission control circuit is electrically connected to the input terminal, a first node, a second node, and is configured to control a potential of the first node and a potential of the second node under the control of a first clock signal, a second clock signal and an input signal;
the first output circuit is respectively electrically connected to a signal writing-in terminal, the first node, the second node, a first voltage terminal and the signal output terminal, and is configured to connect the signal output terminal and the first voltage terminal under the control of the potential of the first node, and control to connect the signal output terminal and the signal writing-in terminal under the control of the potential of the second node;
the output control circuit is respectively electrically connected to a first output control terminal, a second output control terminal, a second voltage terminal, the signal writing-in terminal, the signal output terminal and the first voltage terminal, configured to control to connect the signal writing-in terminal and the second voltage terminal under the control of a second output control signal provided by the second output control terminal, and control to connect the signal output terminal and the first voltage terminal under the control of a first output control signal provided by the first output control terminal.

2. The signal generating circuit according to claim 1, further comprising a shift signal output terminal and a shift signal output circuit; wherein
the shift signal output circuit is electrically connected to the first node, the second node and the shift signal output terminal respectively, and is configured to control the shift signal output terminal to output the shift signal under the control of the potential of the first node and the potential of the second node.

3. The signal generating circuit according to claim 2, wherein the shift signal output circuit comprises a first shift output transistor and a second shift output transistor;
a control electrode of the first shift output transistor is electrically connected to the first node, a first electrode of the first shift output transistor is electrically connected to the shift signal output terminal, and a second electrode of the first shift output transistor is electrically connected to the first voltage terminal;
a control electrode of the second shift output transistor is electrically connected to the second node, a first electrode of the second shift output transistor is electrically connected to the second voltage terminal, and a second electrode of the second shift output transistor is electrically connected to the shift signal output terminal.

4. The signal generating circuit according to claim 1, wherein the output control circuit comprises a first output control transistor and a second output control transistor;
a control electrode of the first output control transistor is electrically connected to the first output control terminal, a first electrode of the first output control transistor is electrically connected to the signal output terminal, and a second electrode of the first output control transistor is electrically connected to the first voltage terminal;
a control electrode of the second output control transistor is electrically connected to the second output control terminal, a first electrode of the second output control transistor is electrically connected to the second voltage terminal, and a second electrode of the second output control transistor is electrically connected to the signal writing-in terminal.

5. The signal generating circuit according to claim 1, wherein the first output circuit comprises a first output transistor and a second output transistor;
   a control electrode of the first output transistor is electrically connected to the first node, a first electrode of the first output transistor is electrically connected to the signal output terminal, and a second electrode of the first output transistor is electrically connected to the first voltage terminal;
   a control electrode of the second output transistor is electrically connected to the second node, a first electrode of the second output transistor is electrically connected to the signal writing-in terminal, and a second electrode of the second output transistor is electrically connected to the signal output terminal.

6. The signal generating circuit according to claim 1, wherein the transmission control circuit comprises a first control node control circuit, a first input node control circuit, a first node control circuit, a first energy storage circuit and a second node control circuit;
   the first control node control circuit is configured to control to write a second voltage into a first control node under the control of the first clock signal, and to write the first clock signal into the first control node under the control of the potential of the second node;
   the first input node control circuit is configured to write the second clock signal into the first input node under the control of a potential of the first control node;
   a first terminal of the first energy storage circuit is electrically connected to the first control node, a second terminal of the first energy storage circuit is electrically connected to the first input node, and the first energy storage circuit is configured to control a potential of the first input node according to the potential of the first control node;
   the first node control circuit is configured to control the first input node to be electrically connected to the first node under the control of the second clock signal, and to write the first voltage into the first node under the control of the potential of the second node and maintain the potential of the first node;
   the second node control circuit is configured to write the input signal into the second node under the control of the first clock signal, and under the control of the second clock signal and the potential of the first control node, control the second node to be connected to the first voltage terminal, and control the potential of the second node according to the second clock signal.

7. The signal generating circuit according to claim 6, wherein the first control node control circuit comprises a first control transistor and a second control transistor;
   a control electrode of the first control transistor is electrically connected to the first clock signal terminal, a first electrode of the first control transistor is electrically connected to the second voltage terminal, and a second electrode of the first control transistor is electrically connected to the first control transistor node;
   a control electrode of the second control transistor is electrically connected to the second node, a first electrode of the second control transistor is electrically connected to the first clock signal terminal, and a second electrode of the second control transistor is electrically connected to the first control node;

the first input node control circuit includes a third control transistor;
   a control electrode of the third control transistor is electrically connected to the first control node, a first electrode of the third control transistor is electrically connected to the first input node, and a second electrode of the third control transistor is electrically connected to the second clock signal terminal;
   the first energy storage circuit includes a first storage capacitor;
   a first terminal of the first storage capacitor is electrically connected to the first control node, and a second terminal of the first storage capacitor is electrically connected to the first input node;
   the first node control circuit includes a fourth control transistor, a fifth control transistor and a second storage capacitor;
   a control electrode of the fourth control transistor is electrically connected to the second clock signal terminal, a first electrode of the fourth control transistor is electrically connected to the first input node, and a second electrode of the fourth control transistor is electrically connected to the first node;
   a control electrode of the fifth control transistor is electrically connected to the second node, a first electrode of the fifth control transistor is electrically connected to the first voltage terminal, and a second electrode of the fifth control transistor is electrically connected to the first node;
   a first terminal of the second storage capacitor is electrically connected to the first node, and a second terminal of the second storage capacitor is electrically connected to the first voltage terminal.

8. The signal generating circuit according to claim 6, wherein the second node control circuit comprises a sixth control transistor, a seventh control transistor, an eighth control transistor and a third storage capacitor;
   a control electrode of the sixth control transistor is electrically connected to the first clock signal terminal, a first electrode of the sixth control transistor is electrically connected to the input terminal, and a second electrode of the sixth control transistor is electrically connected to the second node, the input terminal is used to provide an input signal;
   a control electrode of the seventh control transistor is electrically connected to the second clock signal terminal, and a first electrode of the seventh control transistor is electrically connected to the second node;
   a control electrode of the eighth control transistor is electrically connected to the first control node, a first electrode of the eighth control transistor is electrically connected to a second electrode of the seventh control transistor, and a second electrode of the eighth control transistor is electrically connected to the first voltage terminal;
   a first terminal of the third storage capacitor is electrically connected to the second node, and a second terminal of the third storage capacitor is electrically connected to the second clock signal terminal.

9. The signal generating circuit according to claim 6, wherein the second node control circuit comprises a sixth control transistor, a seventh control transistor, an eighth control transistor, a ninth control transistor, a tenth control transistor, a third control transistor storage capacitor and a fourth storage capacitor, wherein
   a control electrode of the sixth control transistor is electrically connected to the first clock signal terminal, a first electrode of the sixth control transistor is electrically connected to the input terminal, and a second electrode of the sixth control transistor is electrically connected to a third node, the input terminal is used to provide an input signal;

a control electrode of the seventh control transistor is electrically connected to the second clock signal terminal, and a first electrode of the seventh control transistor is electrically connected to the second node;

a control electrode of the eighth control transistor is electrically connected to the first control node, a first electrode of the eighth control transistor is electrically connected to a second electrode of the seventh control transistor, and a second electrode of the eighth control transistor is electrically connected to the first voltage terminal;

a control electrode of the ninth control transistor and a first electrode of the ninth control transistor are electrically connected to the third node, and a second electrode of the ninth control transistor is electrically connected to the second node;

a control electrode of the tenth control transistor is electrically connected to the second clock signal terminal, a first electrode of the tenth control transistor is electrically connected to the second node, and a second electrode of the tenth control transistor is electrically connected to the second electrode of the seventh control transistor;

a first terminal of the third storage capacitor is electrically connected to the third node, and a second terminal of the third storage capacitor is electrically connected to the second clock signal terminal;

a first terminal of the fourth storage capacitor is electrically connected to the second node, and a second terminal of the fourth storage capacitor is electrically connected to the second voltage terminal.

10. The signal generating circuit according to claim 1, wherein the transmission control circuit comprises a fourth node control circuit, a second node control circuit, a first node control circuit, and a fifth node control circuit, the fourth node control circuit is configured to write the second voltage into a fourth node under the control of the first clock signal, and write the first clock signal into the fourth node under the control of a potential of a fifth node;

the fifth node control circuit is configured to write the input signal into the fifth node under the control of the first clock signal, and to maintain the potential of the fifth node;

the second node control circuit is configured to write the input signal into the first node under the control of the first clock signal, and write the first voltage into the second node under the control of the second clock signal and the potential of the first node;

the first node control circuit is configured to write the second clock signal into the first node under the control of the potential of the fourth node and the second clock signal, and to write the first voltage into the first node under the control of the potential of the second node.

11. The signal generating circuit according to claim 10, wherein the fourth node control circuit comprises an eleventh control transistor, a twelfth control transistor, and a thirteenth control transistor;

a control electrode of the eleventh control transistor is electrically connected to the first clock signal terminal, a first electrode of the eleventh control transistor is electrically connected to the second voltage terminal, and a second electrode of the eleventh control transistor is electrically connected to the fourth node;

a control electrode of the twelfth control transistor is electrically connected to the fifth node, and a first electrode of the twelfth control transistor is electrically connected to the first clock signal terminal;

a control electrode of the thirteenth control transistor is electrically connected to the fifth node, a first electrode of the thirteenth control transistor is electrically connected to a second electrode of the twelfth control transistor, and a second electrode of the thirteenth control transistor is electrically connected to the fourth node;

the first node control circuit includes a fourteenth control transistor, a fifteenth control transistor, a fifth storage capacitor, a second storage capacitor and a sixteenth control transistor, wherein, a control electrode of the fourteenth control transistor is electrically connected to the fourth node, and a second electrode of the fourteenth control transistor is electrically connected to the second clock signal terminal;

a first terminal of the fifth storage capacitor is electrically connected to a second electrode of the fourteenth control transistor, and a second terminal of the fifth storage capacitor is electrically connected to the fourth node;

a first terminal of the second storage capacitor is electrically connected to the first node, and a second terminal of the second storage capacitor is electrically connected to the first voltage terminal;

a control electrode of the fifteenth control transistor is electrically connected to the second clock signal terminal, a first electrode of the fifteenth control transistor is electrically connected to the first node, and a second electrode of the fifteenth control transistor is electrically connected to the second electrode of the fourteenth control transistor;

a control electrode of the sixteenth control transistor is electrically connected to the second node, a first electrode of the sixteenth control transistor is electrically connected to the first node, and a second electrode of the sixteenth control transistor is electrically connected to the first voltage terminal;

the fifth node control circuit includes a seventeenth control transistor and a sixth storage capacitor, a control electrode of the seventeenth control transistor is electrically connected to the first clock signal terminal, a first electrode of the seventeenth control transistor is electrically connected to the input terminal, and a second electrode of the seventeenth control transistor is electrically connected to the fifth node;

a first terminal of the sixth storage capacitor is electrically connected to the fifth node, and a second terminal of the sixth storage capacitor is electrically connected to the first voltage terminal.

12. The signal generating circuit according to claim 10, wherein the second node control circuit comprises an eighteenth control transistor, a nineteenth control transistor, a twentieth control transistor, and a seventh storage capacitor, wherein, a control electrode of the eighteenth control transistor is electrically connected to the first clock signal terminal, a first electrode of the eighteenth control transistor is electrically connected to the input terminal, and a second electrode of the eighteenth control transistor is electrically connected to the second node;

a control electrode of the nineteenth control transistor is electrically connected to the fourth node, and a second electrode of the nineteenth control transistor is electrically connected to the first voltage terminal;

a control electrode of the twentieth control transistor is electrically connected to the second clock signal terminal, a first electrode of the twentieth control transistor is electrically connected to the second node, and a second electrode of the twentieth control transistor is electrically connected to the first electrode of the nineteenth control transistor;

a first terminal of the seventh storage capacitor is electrically connected to the second node, and a second terminal of the seventh storage capacitor is electrically connected to the second clock signal terminal.

13. The signal generating circuit according to claim 10, wherein the second node control circuit comprises an eighteenth control transistor, a nineteenth control transistor, a twentieth control transistor, a seventh storage capacitor, a twenty-first control transistor, a twenty-second control transistor, and an eighth storage capacitor, a control electrode of the eighteenth control transistor is electrically connected to the first clock signal terminal, a first electrode of the eighteenth control transistor is electrically connected to the input terminal, and a second electrode of the eighteenth control transistor is electrically connected to a sixth node;

a control electrode of the twenty-second control transistor and a first electrode of the twenty-second control transistor are both electrically connected to the sixth node, and a second electrode of the twenty-second control transistor is electrically connected to the second node;

a first terminal of the eighth storage capacitor is electrically connected to the sixth node, and a second terminal of the eighth storage capacitor is electrically connected to the second clock signal terminal;

a control electrode of the nineteenth control transistor is electrically connected to the fourth node, and a second electrode of the nineteenth control transistor is electrically connected to the first voltage terminal;

a control electrode of the twentieth control transistor is electrically connected to the second clock signal terminal, a first electrode of the twentieth control transistor is electrically connected to the sixth node, and a second electrode of the twentieth control transistor is electrically connected to a first electrode of the nineteenth control transistor;

a control electrode of the twenty-first control transistor is electrically connected to the second clock signal terminal, a first electrode of the twenty-first control transistor is electrically connected to the second node, and a second electrode the twenty-first control transistor is electrically connected to the second electrode of the twentieth control transistor;

a control electrode of the twenty-second control transistor and a first electrode of the twenty-second control transistor are both electrically connected to the sixth node, and a second electrode of the twenty-second control transistor is electrically connected to the second node;

a first terminal of the seventh storage capacitor is electrically connected to the second node, and a second terminal of the seventh storage capacitor is electrically connected to the second voltage terminal.

14. A signal generation method, applied to a signal generation circuit, wherein the signal generation circuit comprises an input terminal, a signal output terminal, a transmission control circuit, a first output circuit, and an output control circuit;

the transmission control circuit is electrically connected to the input terminal, a first node, a second node, and is configured to control a potential of the first node and a potential of the second node under the control of a first clock signal, a second clock signal and an input signal;

the first output circuit is respectively electrically connected to a signal writing-in terminal, the first node, the second node, a first voltage terminal and the signal output terminal, and is configured to connect the signal output terminal and the first voltage terminal under the control of the potential of the first node, and control to connect the signal output terminal and the signal writing-in terminal under the control of the potential of the second node;

the output control circuit is respectively electrically connected to a first output control terminal, a second output control terminal, a second voltage terminal, the signal writing-in terminal, the signal output terminal and the first voltage terminal, configured to control to connect the signal writing-in terminal and the second voltage terminal under the control of a second output control signal provided by the second output control terminal, and control to connect the signal output terminal and the first voltage terminal under the control of a first output control signal provided by the first output control terminal, the signal generation method comprising:

controlling, by the transmission control circuit, the potential of the first node and the potential of the second node under the control of the first clock signal, the second clock signal and the input signal;

controlling, by the first output circuit, the signal output terminal to be connected to the first voltage terminal under the control of the potential of a first node, and the signal output terminal to be connected to the signal writing-in terminal under the control of the potential of the second node;

controlling, by the output control circuit, the signal writing-in terminal to be connected to the second voltage terminal under the control of the second output control signal, and the signal output terminal to be connected to the first voltage terminal under the control of the first output control signal.

* * * * *